(12) United States Patent
Happ et al.

(10) Patent No.: US 7,688,618 B2
(45) Date of Patent: Mar. 30, 2010

(54) INTEGRATED CIRCUIT HAVING MEMORY HAVING A STEP-LIKE PROGRAMMING CHARACTERISTIC

(75) Inventors: Thomas Happ, Tarrytown, NY (US); Jan Boris Philipp, Peekskill, NY (US)

(73) Assignee: Qimonda North America Corp., Cary, NC (US)

( * ) Notice: Subject to any disclaimer, the term of this patent is extended or adjusted under 35 U.S.C. 154(b) by 470 days.

(21) Appl. No.: 11/488,869

(22) Filed: Jul. 18, 2006

(65) Prior Publication Data

US 2008/0019170 A1 Jan. 24, 2008

(51) Int. Cl.
*G11C 11/00* (2006.01)
(52) U.S. Cl. .................................. 365/163; 365/189.16
(58) Field of Classification Search .................. 365/163, 365/189.16
See application file for complete search history.

(56) References Cited

U.S. PATENT DOCUMENTS

| | | | |
|---|---|---|---|
| 6,507,061 | B1 | 1/2003 | Hudgens et al. |
| 6,671,207 | B1 * | 12/2003 | Parker .................... 365/185.22 |
| 6,674,115 | B2 | 1/2004 | Hudgens et al. |
| 6,838,692 | B1 | 1/2005 | Lung |
| 6,927,410 | B2 | 8/2005 | Chen |
| 6,998,289 | B2 | 2/2006 | Hudgens et al. |
| 2003/0080427 | A1 | 5/2003 | Hudgens et al. |
| 2004/0004857 | A1 * | 1/2004 | Manea .................... 365/185.03 |
| 2005/0112896 | A1 | 5/2005 | Hamann et al. |
| 2005/0127349 | A1 | 6/2005 | Horak et al. |

OTHER PUBLICATIONS

S. Lai, "Current Status of the Phase Change Memory and its Future" IEDM 2003.
S. Lai, T. Lowrey, "OUM-a 180 nm Nonvolatile Memory Cell Element Technology for Stand Alone and Embedded Applications", IEDM 2001.
S. Ahn, "Highly reliable 50 nm contact cell technology for 256Mb PRAM", VLSI 2005.
Pirvano, submission to NVSMW, 2006. "Scaling Analysis of Phase-Change Memory Technology".
F. Pellizer, et al, "Novel Utrench Phase Change Memory Cell for Embedded and Standalone Non-Volatile Memory Applications", VLSI 2004.
S.L. Cho, "Highly Scalable On-Axis Confined Cell Structure for High Density PRAM Beyond 256Mb", VLSI 2005.
Jeong, et al. "Switching Current Scaling and Reliability Evaluation in Pram", NVSMW 2004.
Y.N. Hwang, et al. "Full Integration and Reliability Evaluation of Phase-Change RAM Based on 0.24um-CMOS Technologies".
H. Horii, et al. "A Novel Cell Technology using N-doped GeSbTe films for phage change RAM", VLSI, 2003.

(Continued)

*Primary Examiner*—Vu A Le
(74) *Attorney, Agent, or Firm*—Dicke, Billig & Czaja, PLLC

(57) ABSTRACT

A memory cell includes a first electrode, a second electrode, and phase-change material between the first electrode and the second electrode. The phase-change material has a step-like programming characteristic.

19 Claims, 17 Drawing Sheets

OTHER PUBLICATIONS

Y.H Ha, et al, "An Edge Contact Type Cell for Phase Change RAM Featuring Very Low Power Consumption", VLSI, 2003.

ECD Ovonics, Research Report, Ovonic Unified Memory. http://www.ovonics.com/PDFs/ELEC_Memory_Research_Report/OUM.pdf, 1999.

A Korean Office Action for Korean Application No. 10-2007-0071876 mailed on May 29, 2008 (3 pages).

Y.N. Hwang, et al. "Full Integration and Reliability Evaluation of Phase-Change RAM Based on 0.24um-CMOS Technologies", 2008.

* cited by examiner

INTEGRATED CIRCUIT HAVING MEMORY HAVING A STEP-LIKE PROGRAMMING CHARACTERISTIC

CROSS-REFERENCE TO RELATED APPLICATIONS

This Utility Patent Application is related to U.S. patent application Ser. No. 11/488,422, entitled "PHASE CHANGE MEMORY CELL HAVING A STEP-LIKE PROGRAMMING CHARACTERISTIC," and U.S. patent application Ser. No. 11/488,313, entitled "PHASE CHANGE MEMORY CELL HAVING A STEP-LIKE PROGRAMMING CHARACTERISTIC," both filed on the same day as the present application, and both of which are incorporated herein by reference.

BACKGROUND

One type of non-volatile memory is resistive memory. Resistive memory utilizes the resistance value of a memory element to store one or more bits of data. For example, a memory element programmed to have a high resistance value may represent a logic "1" data bit value, and a memory element programmed to have a low resistance value may represent a logic "0" data bit value. The resistance value of the memory element is switched electrically by applying a voltage pulse or a current pulse to the memory element. One type of resistive memory is phase change memory. Phase change memory uses a phase change material for the resistive memory element.

Phase change memories are based on phase change materials that exhibit at least two different states. Phase change material may be used in memory cells to store bits of data. The states of phase change material may be referred to as amorphous and crystalline states. The states may be distinguished because the amorphous state generally exhibits higher resistivity than does the crystalline state. Generally, the amorphous state involves a more disordered atomic structure, while the crystalline state involves a more ordered lattice. Some phase change materials exhibit more than one crystalline state, e.g. a face-centered cubic (FCC) state and a hexagonal closest packing (HCP) state. These two crystalline states have different resistivities and may be used to store bits of data. In the following description, the amorphous state generally refers to the state having the higher resistivity, and the crystalline state generally refers to the state having the lower resistivity.

Phase change in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself, or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states. If the phase change memory cell is programmed to one of three different resistance levels, 1.5 bits of data per cell can be stored. If the phase change memory cell is programmed to one of four different resistance levels, two bits of data per cell can be stored, and so on. For simplicity, the description in this disclosure is substantially focused on four different resistance levels or states and two bits of data per cell. This is for illustrative purposes only, however, and not intended to limit the scope of the invention. In principle it is possible to store three or more states.

To program a phase change memory cell to an intermediate resistance value, the amount of crystalline material coexisting with amorphous material and hence the cell resistance is controlled via a suitable write strategy. Reliable and repeatable programming of a phase change memory cell requires that substantially similar programming conditions result in substantially similar resistance values. Substantially similar programming conditions including substantially identical current and/or voltage pulses applied to typical phase change memory cells, however, may result in different resistance values due to fabrication fluctuations, electrical noise, temperature variations, or other temporal fluctuations.

For these and other reasons, there is a need for the present invention.

SUMMARY

One embodiment of the present invention provides a memory cell. The memory cell includes a first electrode, a second electrode, and phase-change material between the first electrode and the second electrode. The phase-change material has a step-like programming characteristic.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
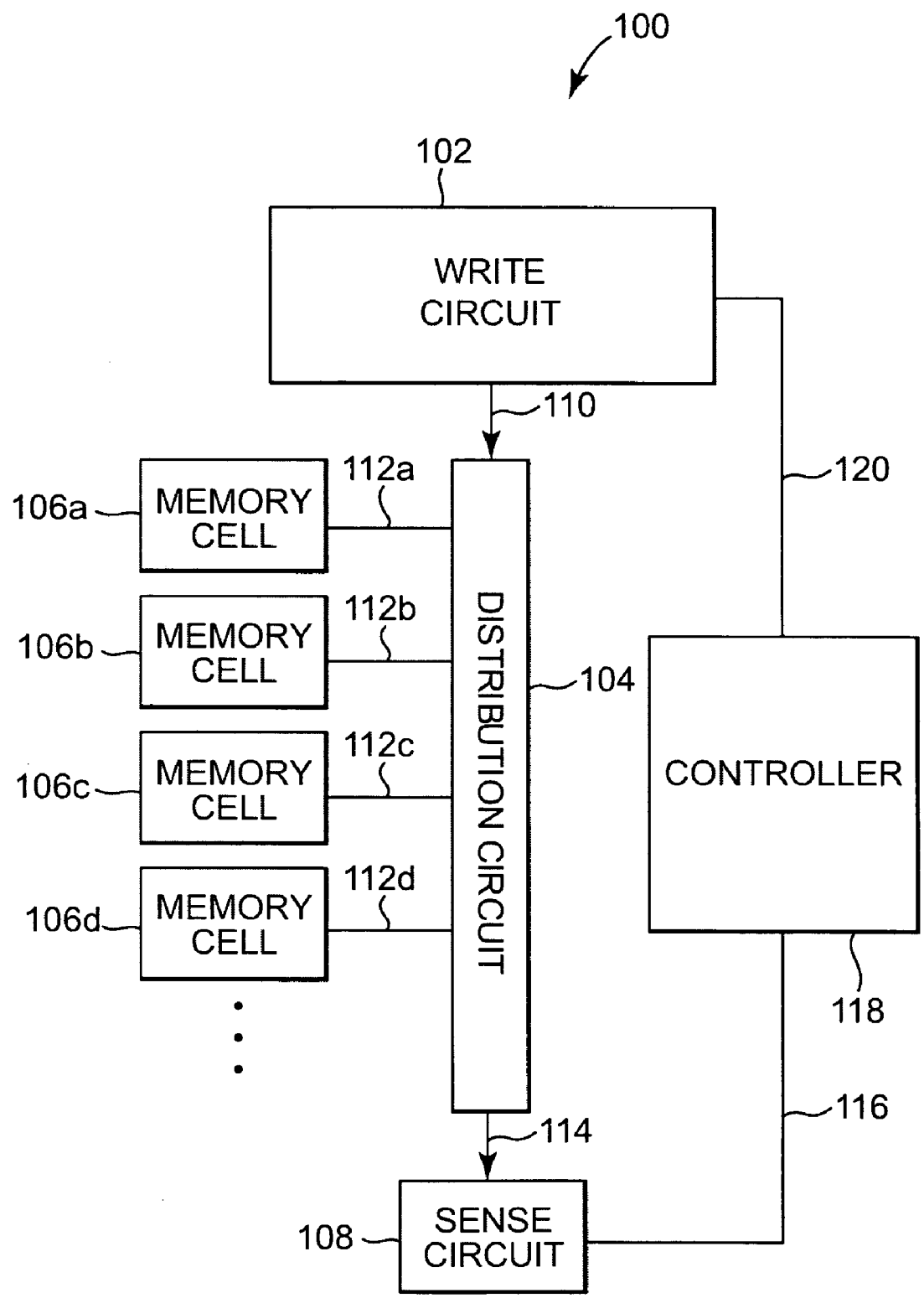
FIG. 1A is a block diagram illustrating one embodiment of a memory device.

FIG. 1A is a block diagram illustrating one embodiment of a memory device 100. Memory device 100 includes a write circuit 102, a distribution circuit 104, memory cells 106a, 106b, 106c, and 106d, a sense circuit 108, and a controller 118. Each of the memory cells 106a-106d is a phase change memory cell that stores data based on the amorphous and crystalline states of phase change material in the memory cell. Also, each of the memory cells 106a-106d can be programmed into one of more than two states by programming the phase change material to have intermediate resistance values. To program one of the memory cells 106a-106d to an intermediate resistance value, the amount of crystalline material coexisting with amorphous material—and hence the cell resistance—is controlled by controller 118 following a suitable write strategy.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. In addition, distribution circuit 104 is electrically coupled to sense circuit 108 through signal path 114, and sense circuit 108 is electrically coupled to controller 118 through signal path 116. Controller 118 is also electrically coupled to write circuit 102 through signal path 120.

Each of the memory cells 106a-106d includes a phase change material that may be changed from an amorphous state to a crystalline state or from a crystalline state to an amorphous state under the influence of temperature change. The amount of crystalline phase change material coexisting with amorphous phase change material in one of the memory cells 106a-106d thereby defines more than two states for storing data within memory device 100. Memory cells 106a-106d have a step-like programming characteristic to facilitate multi-bit data storage.

In one embodiment, the phase change material of each memory cell 106a-106d forms a step-like pattern to achieve a step-like programming characteristic. When current is applied to the step-like pattern, the current density through each step varies. The step or steps having the narrowest cross-section provide the highest current density and the step or steps having the widest cross-section provide the lowest current density. The step or steps having the highest current density transition from an amorphous state to a crystalline or from a crystalline state to an amorphous state before the step or steps providing lower current densities. The step or steps having the highest current density transition first since the temperature induced within the phase change material is greater within the step or steps providing the highest current density. If a higher current is passed through the cell, the next narrowest step or steps transition states. In this way, a selected number of steps of phase change material in the step-like pattern are programmed to reliably and repeatably provide a specific resistance value.

In another embodiment, one or more of the phase change material steps of the step-like pattern are laterally surrounded with a dielectric material, such as a low-k material, to vary the thermal environment between steps having different cross-sections. In one embodiment, the dielectric material has a lower thermal conductivity than insulation material that laterally surrounds the phase change material steps that are not surrounded with the dielectric material. By varying the thermal environment between the steps in the step-like pattern, the temperature induced within each step is further controlled, such that a selected number of steps of phase change material in the step-like pattern are programmed to reliably and repeatably provide a specific resistance value.

In another embodiment, at least two of the phase change material steps of the step-like pattern include different phase change materials. The at least two phase change materials have different crystallization temperatures. By varying the crystallization temperature between the steps in the step-like pattern, the transition of each step is further controlled, such that a selected number of steps of phase change material in the step-like pattern are programmed to reliably and repeatably provide a specific resistance value. In other embodiments, the step-like pattern, the varying thermal environment, and the varying of phase change materials can be combined in any suitable combination to achieve a step-like programming characteristic and to facilitate the reliable programming of multiple states.

In the amorphous state, a phase change material exhibits significantly higher resistivity than in the crystalline state. Therefore, by controlling the amorphous and crystalline fractions of the phase change material, the more than two states of memory cells 106a-106d differ in their electrical resistivity. In one embodiment, the more than two states include three states and a trinary system is used, wherein the three states are assigned bit values of "0", "1", and "2". In another embodiment, the more than two states are four states that are assigned multi-bit values, such as "00", "01", "10", and "11". In other embodiments, the more than two states can be any suitable number of states in the phase change material of a memory cell.

Controller 118 controls the operation of write circuit 102 and sense circuit 108. Controller 118 includes a microprocessor, microcontroller, or other suitable logic circuitry for controlling the operation of write circuit 102 and sense circuit 108. Controller 118 controls write circuit 102 for setting the resistance states of memory cells 106a-106d. Controller 118 controls sense circuit 108 for reading the resistance states of memory cells 106a-106d.

In one embodiment, write circuit 102 provides voltage pulses to distribution circuit 104 through signal path 110, and distribution circuit 104 controllably directs the voltage pulses to memory cells 106a-106d through signal paths 112a-112d. In one embodiment, distribution circuit 104 includes a plurality of transistors that controllably direct voltage pulses to each of the memory cells 106a-106d. In other embodiments, write circuit 102 provides current pulses to distribution circuit 104 through signal path 110, and distribution circuit 104 controllably directs the current pulses to memory cells 106a-106d through signal paths 112a-112d.

Sense circuit 108 reads each of the more than two states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d. In one embodiment, to read the resistance of one of the memory cells 106a-106d, sense circuit 108 provides current that flows through one of the memory cells 106a-106d and sense circuit 108 reads the voltage across that one of the memory cells 106a-106d. In one embodiment, sense circuit 108 provides voltage across one of the memory cells 106a-106d and reads the current that flows through that one of the memory cells 106a-106d. In one embodiment, write circuit 102 provides voltage across one of the memory cells 106a-106d and sense circuit 108 reads the current that flows through that one of the memory cells 106a-106d. In one embodiment, write circuit 102 provides current through one of the memory cells 106a-106d and sense circuit 108 reads the voltage across that one of the memory cells 106a-106d.

To program a memory cell 106a-106d within memory device 100, write circuit 102 generates a current or voltage pulse for heating the phase-change material in the target memory cell. In one embodiment, write circuit 102 generates an appropriate current or voltage pulse, which is fed into distribution circuit 104 and distributed to the appropriate target memory cell 106a-106d. The current or voltage pulse amplitude and duration are controlled by controller 118 depending on the specific state to which the target memory cell 106a-106d is being programmed. Generally, a "set" operation of a memory cell is heating the phase-change material of the target memory cell above its crystallization temperature (but below its melting temperature) long enough to achieve the crystalline state or a partially crystalline and partially amorphous state. Generally, a "reset" operation of a memory cell is heating the phase-change material of the target memory cell above its melting temperature, and then quickly quench cooling the material, thereby achieving the amorphous state or a partially amorphous and partially crystalline state. A memory cell can be programmed to a resistance state between an amorphous state and a crystalline state by applying a partial "set" or a partial "reset" pulse to the memory cell to provide amorphous and crystalline fractions of the phase change material.

Figure 1B:
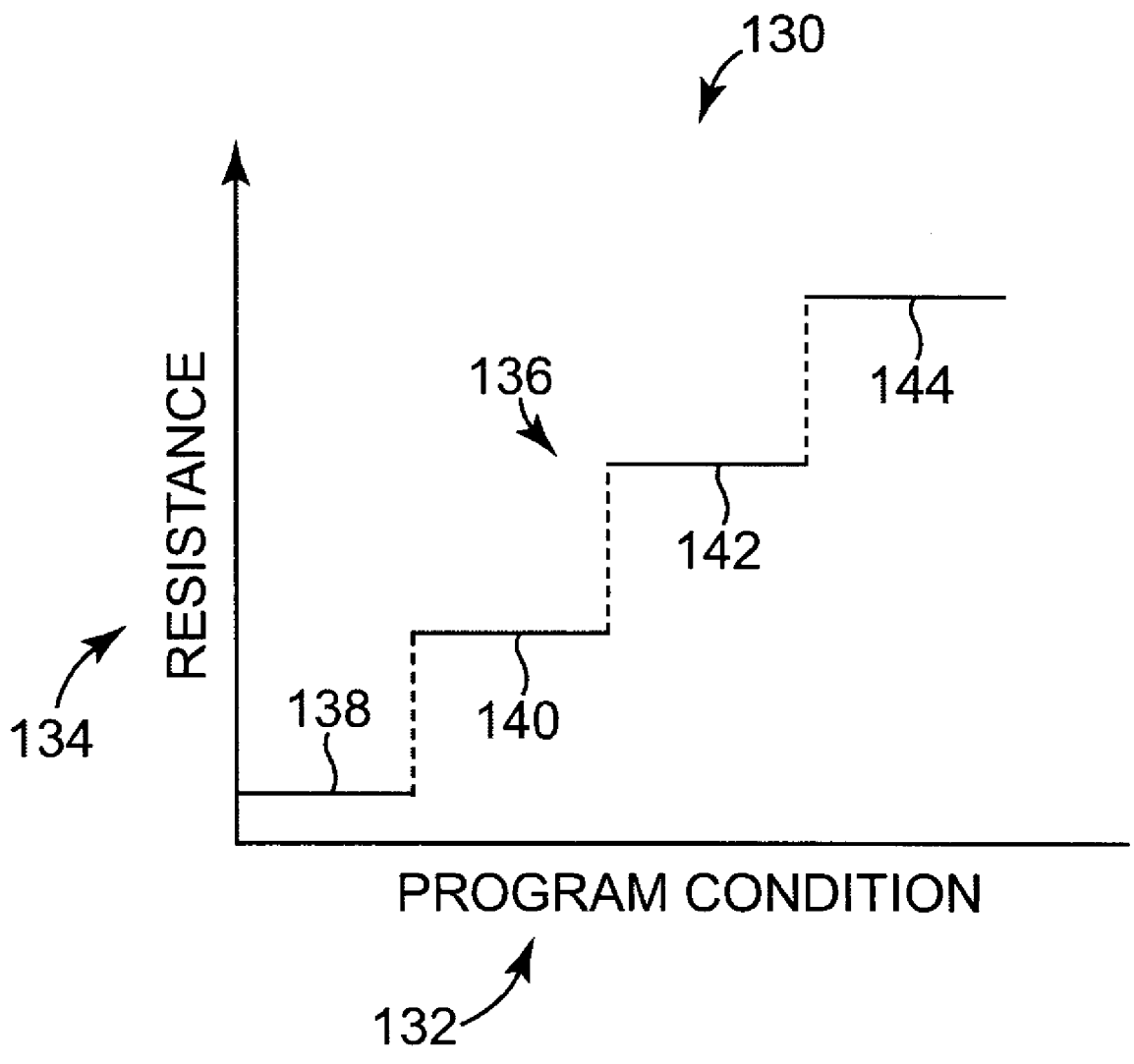
FIG. 1B is a graph illustrating one embodiment of a step-like programming characteristic for phase change memory cells.

FIG. 1B is a graph 130 illustrating one embodiment of a step-like programming characteristic 136 for phase change memory cells 106a-106d. Graph 130 includes program condition on x-axis 132 and resistance on y-axis 134. Suitable program parameters can include for example write time or pulse amplitude. Step-like programming characteristic 136 provides reduced variation of programmed resistance around a selected program condition. In one embodiment, a substantially constant resistance level or step is present at a selected program condition.

At a first program condition, a memory cell is programmed to a first resistance step or state as indicated at 138. In one embodiment, the step indicated at 138 is a "00" state. At a second program condition, a memory cell is programmed to a second resistance step or state as indicated at 140. The second resistance state is greater than the first resistance state. In one embodiment, the step indicated at 140 is a "01" state. At a third program condition, a memory cell is programmed to a third resistance step or state as indicated at 142. The third resistance state is greater than the second resistance state. In one embodiment, the step indicated at 142 is a "10" state. At a fourth program condition, a memory cell is programmed to a fourth resistance step or state as indicated at 144. The fourth resistance state is greater than the third resistance state. In one embodiment, the step indicated at 144 is a "11" state. In other embodiments, a memory cell can have any suitable step-like programming characteristic including any suitable number of resistance steps or states. The following embodiments of phase change memory cells provide a step-like programming characteristic.

Figure 2A:
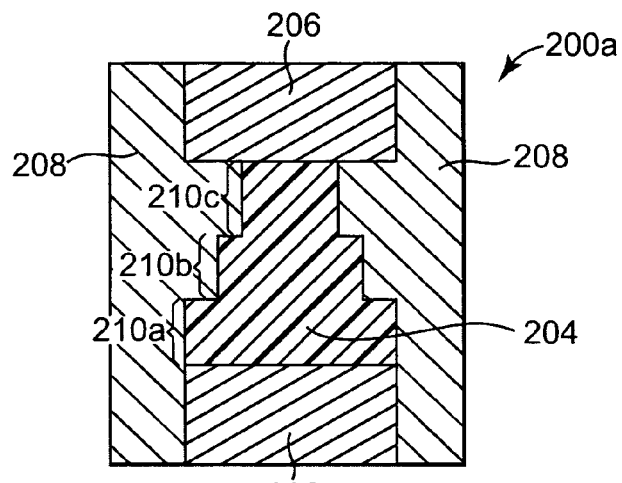
FIG. 2A illustrates a cross-sectional view of one embodiment of a phase change memory cell.

FIG. 2A illustrates a cross-sectional view of one embodiment of a phase change memory cell 200a. In one embodiment, phase change memory cell 200a is a pillar based phase change memory cell. Phase change memory cell 200a includes a first electrode 202, phase change material 204, a second electrode 206, and insulation material 208. Phase change material 204 includes a first phase change portion 210a, a second phase change portion 210b, and a third phase change portion 210c. First electrode 202 contacts first phase change portion 210a. First phase change portion 210a contacts second phase change portion 210b. Second phase change portion 210b contacts third phase change portion 210c, and third phase change portion 210c contacts second electrode 206. Phase change material 204 provides a storage location for storing two bits of data. Insulation material 208 laterally completely encloses phase change material 204, first electrode 202, and second electrode 206. In one embodiment, each of the memory cells 106a-106d is similar to phase change memory cell 200a.

Phase change portions 210a-210c provide a step-like pattern. Phase change portions 210a-210c provide distinct transitions between one phase change portion to another. Each phase change portion 210a-210c forms a substantially rectangular or cylindrical shape. First phase change portion 210a has a larger cross-section than second phase change portion 210b. Second phase change portion 210b has a larger cross-section than third phase change portion 210c.

Insulation material 208 can be any suitable insulator, such as $SiO_2$, fluorinated silica glass (FSG), boro-phosphorous silicate glass (BPSG), boro-silicate glass (BSG), or low-k material. First electrode 202 and second electrode 206 can be any suitable electrode material, such as TiN, TaN, W, TiSiN, TiAlN, or TaAlN.

Phase change material 204 may be made up of a variety of materials in accordance with the present invention. Generally, chalcogenide alloys that contain one or more elements from group VI of the periodic table are useful as such materials. In one embodiment, phase change material 204 of memory cell 200a is made up of a chalcogenide compound material, such as GeSbTe, SbTe, GeTe, or AgInSbTe. In another embodiment, phase change material 204 is chalcogen free, such as GeSb, GaSb, InSb, or GeGaInSb. In other embodiments, phase change material 204 is made up of any suitable material including one or more of the elements Ge, Sb, Te, Ga, As, In, Se, and S.

A selection device such as an active device like a transistor or diode, is coupled to first electrode 202 or second electrode 206 to control the application of current or voltage pulses to the other of first electrode 202 or second electrode 206, and thus to phase change material 204, to set and reset phase change material 204. The current density through first phase change portion 210a is less than the current density through second phase change portion 210b since second phase change portion 210b has a narrower cross-section than first phase change portion 210a. The current density through second phase change portion 210b is less than the current density through third phase change portion 210c since third phase change portion 210c has a narrower cross-section than second phase change portion 210b. Thus, a current or voltage pulse having a lower amplitude and/or duration is used to program third phase change portion 210c than to program second phase change portion 210b. Further, a current or voltage pulse having a lower amplitude and/or duration is used to program second phase change portion 210b than to program first phase change portion 210a.

During operation of phase change memory cell 200a, current or voltage pulses are applied between first electrode 202 and second electrode 206 to program phase change memory cell 200a. A first current or voltage pulse having a first amplitude and/or duration programs third phase change portion 210c without significantly affecting first and second phase change portions 210a and 210b. A second current or voltage pulse having a second amplitude and/or duration programs second and third phase change portions 210b and 210c without significantly affecting first phase change portion 210a. The second amplitude and/or duration is greater than the first amplitude and/or duration. A third current or voltage pulse having a third amplitude and/or duration programs phase change portions 210a-210c. The third amplitude and/or duration is greater than the second amplitude and/or duration.

By selectively programming phase change portions 210a-210c, phase change memory cell 200a can be programmed to provide four states in phase change material 204. In one embodiment, in a first state, phase change portions 210a-210c are amorphous. In a second state, third phase change portion 210c is crystalline, and first and second phase change portions 210a and 210b are amorphous. In a third state, second and third phase change portions 210b and 210c are crystalline, and first phase change portion 210a is amorphous. In a fourth state, phase change portions 210a-210c are crystalline. In another embodiment, in a first state, phase change portions 210a-210c are crystalline. In a second state, third phase change portion 210c is amorphous, and first and second phase change portions 210a and 210b are crystalline. In a third state, second and third phase change portions 210b and 210c are amorphous, and first phase change portion 210a is crystalline. In a fourth state, phase change portions 210a-210c are amorphous. In other embodiments, any suitable number of phase change step-like portions 210 are used for obtaining a desired number of states in phase change memory cell 200a.

Figure 2B:
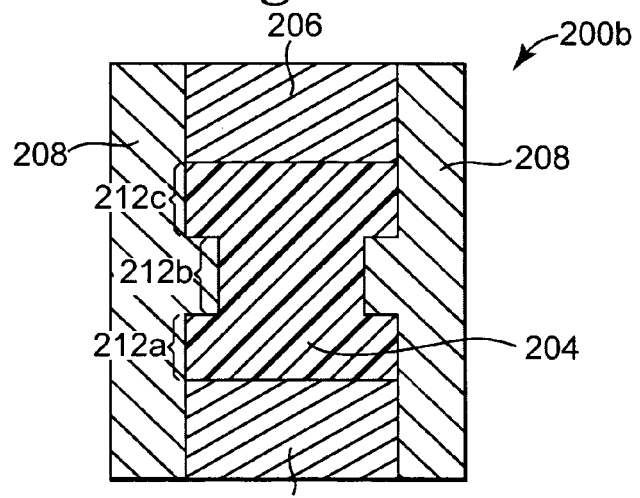
FIG. 2B illustrates a cross-sectional view of another embodiment of a phase change memory cell.

FIG. 2B illustrates a cross-sectional view of another embodiment of a phase change memory cell 200b. Phase change memory cell 200b includes first electrode 202, phase change material 204, second electrode 206, and insulation material 208. Phase change material 204 includes a first phase change portion 212a, a second phase change portion 212b, and a third phase change portion 212c. First electrode 202 contacts first phase change portion 212a. First phase change portion 212a contacts second phase change portion 212b. Second phase change portion 212b contacts third phase change portion 212c, and third phase change portion 212c contacts second electrode 206. Phase change material 204 provides a storage location for storing 1.5 bits of data. Insulation material 208 laterally completely encloses phase change material 204, first electrode 202, and second electrode 206. In one embodiment, each of the memory cells 106a-106d is similar to phase change memory cell 200b.

Phase change portions 212a-212c provide a step-like pattern. Phase change portions 212a-212c provide distinct transitions between one phase change portion to another. Each phase change portion 212a-212c forms a substantially rectangular or cylindrical shape. First phase change portion 212a and third phase change portion 212c have substantially the same cross-sectional widths. Second phase change portion 212b has a narrower cross-section than first phase change portion 212a and third phase change portion 212c.

The current density through first phase change portion 212a and third phase change portion 212c is less than the current density through second phase change portion 212b. Thus, a current or voltage pulse having a lower amplitude and/or duration is used to program second phase change portion 212b than to program first phase change portion 212a and third phase change portion 212c.

During operation of phase change memory cell 200b, current or voltage pulses are applied between first electrode 202 and second electrode 206 to program phase change memory cell 200b. A first current or voltage pulse having a first amplitude and/or duration programs second phase change portion 212b without significantly affecting first and third phase change portions 212a and 212c. A second current or voltage pulse having a second amplitude and/or duration programs phase change portions 212a-212c. The second amplitude and/or duration is greater than the first amplitude and/or duration.

By selectively programming phase change portions 212a-212c, phase change memory cell 200a can be programmed to provide three states in phase change material 204. In one embodiment, in a first state, phase change portions 212a-212c are amorphous. In a second state, second phase change portion 212b is crystalline and first and third phase change portions 212a and 212c are amorphous. In a third state, phase change portions 212a-212c are crystalline. In another embodiment, in a first state, phase change portions 212a-212c are crystalline. In a second state, second phase change portion 212b is amorphous and first and third phase change portions 212a and 212c are crystalline. In a third state, phase change portions 212a-212c are amorphous.

Figure 2C:
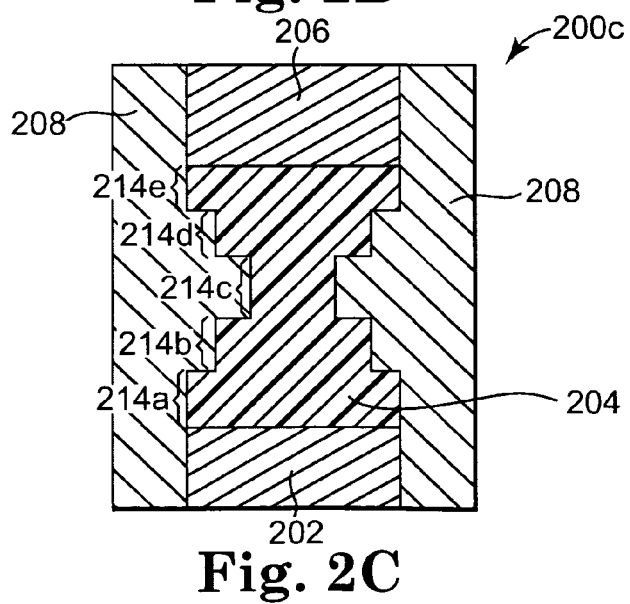
FIG. 2C illustrates a cross-sectional view of another embodiment of a phase change memory cell.

FIG. 2C illustrates a cross-sectional view of another embodiment of a phase change memory cell 200c. Phase change memory cell 200c includes first electrode 202, phase change material 204, second electrode 206, and insulation material 208. Phase change material 204 includes a first phase change portion 214a, a second phase change portion 214b, a third phase change portion 214c, a fourth phase change portion 214d, and a fifth phase change portion 214e. First electrode 202 contacts first phase change portion 214a. First phase change portion 214a contacts second phase change portion 214b. Second phase change portion 214b contacts third phase change portion 214c. Third phase change portion 214c contacts fourth phase change portion 214d. Fourth phase change portion 214d contacts fifth phase change portion 214e, and fifth phase change portion 214e contacts second electrode 206. Phase change material 204 provides a storage location for storing two bits of data. Insulation material 208 laterally completely encloses phase change material 204, first electrode 202, and second electrode 206. In one embodiment, each of the memory cells 106a-106d is similar to phase change memory cell 200c.

Phase change portions 214a-214e provide a step-like pattern. Phase change portions 214a-214e provide distinct transitions between one phase change portion to another. Each phase change portion 214a-214e forms a substantially rectangular or cylindrical shape. First phase change portion 214a and fifth phase change portion 214e have substantially the same cross-sectional widths. Second phase change portion 214b and fourth phase change portion 214d have substantially the same cross-sectional widths. The cross-sections of second and fourth phase change portions 214b and 214d are narrower than the cross-sections of first and fifth phase change portions 214a and 214e. The cross-section of third phase change portion 214c is narrower than the cross-sections of second and fourth phase change portions 214b and 214d.

The current density through first and fifth phase change portions 214a and 214e is less than the current density through second and fourth phase change portions 214b and 214d. The current density through second and fourth phase change portions 214b and 214d is less than the current density through third phase change portion 214c. Thus, a current or voltage pulse having a lower amplitude and/or duration is used to program third phase change portion 214c than to program second and fourth phase change portions 214b and 214d. Further, a current or voltage pulse having a lower amplitude and/or duration is used to program second and fourth phase change portions 214b and 214d than to program first and fifth phase change portions 214a and 214e.

During operation of phase change memory cell 200c, current or voltage pulses are applied between first electrode 202 and second electrode 206 to program phase change memory cell 200c. A first current or voltage pulse having a first amplitude and/or duration programs third phase change portion 214c without significantly affecting first, second, fourth, and fifth phase change portions 214a, 214b, 214d, and 214e. A second current or voltage pulse having a second amplitude and/or duration programs second, third, and fourth phase change portions 214b-214d without significantly affecting first and fifth phase change portions 214a and 214e. The second amplitude and/or duration is greater than the first amplitude and/or duration. A third current or voltage pulse having a third amplitude and/or duration programs phase change portions 214a-214e. The third amplitude and/or duration is greater than the second amplitude and/or duration.

By selectively programming phase change portions 214a-214e, phase change memory cell 200c can be programmed to provide four states in phase change material 204. In one embodiment, in a first state, phase change portions 214a-214e are amorphous. In a second state, third phase change portion 214c is crystalline, and first, second, fourth, and fifth phase change portions 214a, 214b, 214d, and 214e are amorphous. In a third state, second, third, and fourth phase change portions 214b-214d are crystalline, and first and fifth phase change portions 214a and 214e are amorphous. In a fourth state, phase change portions 214a-214e are crystalline. In another embodiment, in a first state, phase change portions 214a-214e are crystalline. In a second state, third phase change portion 214c is amorphous, and first, second, fourth, and fifth phase change portions 214a, 214b, 214d, and 214e are crystalline. In a third state, second, third, and fourth phase change portions 214b-214d are amorphous, and first and fifth phase change portions 214a and 214e are crystalline. In a fourth state, phase change portions 214a-214e are amorphous. In other embodiments, any suitable number of phase change step-like portions 214 are used for obtaining a desired number of states in phase change memory cell 200c.

Figure 3A:
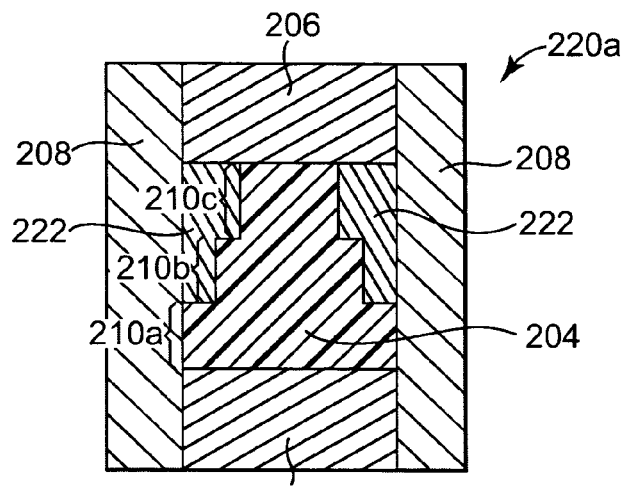
FIG. 3A illustrates a cross-sectional view of another embodiment of a phase change memory cell.

FIG. 3A illustrates a cross-sectional view of another embodiment of a phase change memory cell 220a. Phase change memory cell 220a includes first electrode 202, phase change material 204, second electrode 206, insulation material 208, and dielectric material 222. Phase change material 204 includes first phase change portion 210a, second phase change portion 210b, and third phase change portion 210c. First electrode 202 contacts first phase change portion 210a. First phase change portion 210a contacts second phase change portion 210b. Second phase change portion 210b contacts third phase change portion 210c, and third phase change portion 210c contacts second electrode 206. Phase change material 204 provides a storage location for storing two bits of data. Dielectric material 222, such as a low-k material or another suitable dielectric material, laterally completely encloses second phase change portion 210b and third phase change portion 210c. Insulation material 208 laterally completely encloses dielectric material 222, first phase change portion 210a, first electrode 202, and second electrode 206. In one embodiment, each of the memory cells 106a-106d is similar to phase change memory cell 220a.

Phase change portions 210a-210c provide a step-like pattern. Phase change portions 210a-210c provide distinct transitions between one phase change portion to another. Each phase change portion 210a-210c forms a substantially rectangular or cylindrical shape. First phase change portion 210a has a larger cross-section than second phase change portion 210b. Second phase change portion 210b has a larger cross-section than third phase change portion 210c.

Phase change portions 210a-210c of phase change memory cell 220a have similar phase change material compositions and functions as the corresponding phase change portions 210a-210c of phase change memory cell 200a previously described and illustrated with reference to FIG. 2A.

Dielectric material 222 varies the thermal environment between first phase change portion 210a, which is not surrounded by dielectric material 222, second phase change portion 210b, which is surrounded with a first cross-sectional width of dielectric material 222, and third phase change portion 210c, which is surrounded with a second cross-sectional width of dielectric material 222. The first cross-sectional width of dielectric material 222 surrounding second phase change portion 210b is less than the second cross-sectional width of dielectric material 222 surrounding third phase change portion 210c. In one embodiment, dielectric material 222 has a lower thermal conductivity than insulation material 208. By varying the thermal environment between phase change portions 210a-210c, the temperature induced within each phase change portion 210a-210c is further controlled during programming. Phase change memory cell 220a operates similarly to phase change memory cell 200a previously described and illustrated with reference to FIG. 2A.

Figure 3B:
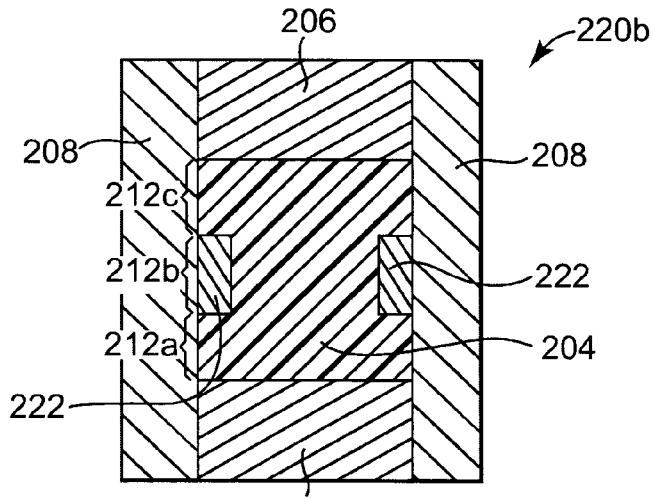
FIG. 3B illustrates a cross-sectional view of another embodiment of a phase change memory cell.

FIG. 3B illustrates a cross-sectional view of another embodiment of a phase change memory cell 220b. Phase change memory cell 220b includes first electrode 202, phase change material 204, second electrode 206, insulation material 208, and dielectric material 222. Phase change material 204 includes first phase change portion 212a, second phase change portion 212b, and third phase change portion 212c. First electrode 202 contacts first phase change portion 212a. First phase change portion 212a contacts second phase change portion 212b. Second phase change portion 212b contacts third phase change portion 212c, and third phase change portion 212c contacts second electrode 206. Phase change material 204 provides a storage location for storing 1.5 bits of data. Dielectric material 222, such as low-k material or other suitable dielectric material, laterally completely encloses second phase change portion 212b. Insulation material 208 laterally completely encloses dielectric material 222, first and third phase change portions 212a and 212c, first electrode 202, and second electrode 206. In one embodiment, each of the memory cells 106a-106d is similar to phase change memory cell 220b.

Phase change portions 212a-212c provide a step-like pattern. Phase change portions 212a-212c provide distinct transitions between one phase change portion to another. Each phase change portion 212a-212c forms a substantially rectangular or cylindrical shape. First phase change portion 212a and third phase change portion 212c have substantially the same cross-sectional widths. Second phase change portion 212b has a narrower cross-section than first phase change portion 212a and third phase change portion 212c.

Phase change portions 212a-212c of phase change memory cell 220b have similar phase change material compositions and functions as the corresponding phase change portions 212a-212c of phase change memory cell 200b previously described and illustrated with reference to FIG. 2B.

Dielectric material 222 varies the thermal environment between first and third phase change portions 212a and 212c, which are not surrounded by dielectric material 222, and second phase change portion 212b, which is surrounded with dielectric material 222. In one embodiment, dielectric material 222 has a lower thermal conductivity than insulation material 208. By varying the thermal environment between phase change portions 212a-212c, the temperature induced within each phase change portion 212a-212c is further controlled during programming. Phase change memory cell 220b operates similarly to phase change memory cell 200b.

Figure 3C:
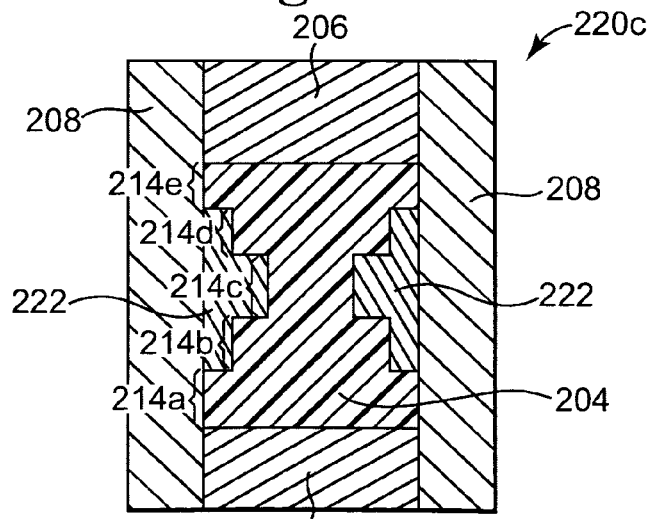
FIG. 3C illustrates a cross-sectional view of another embodiment of a phase change memory cell.

FIG. 3C illustrates a cross-sectional view of another embodiment of a phase change memory cell 220c. Phase change memory cell 220c includes first electrode 202, phase change material 204, second electrode 206, insulation material 208, and dielectric material 222. Phase change material 204 includes first phase change portion 214a, second phase change portion 214b, third phase change portion 214c, fourth phase change portion 214d, and fifth phase change portion 214e. First electrode 202 contacts first phase change portion 214a. First phase change portion 214a contacts second phase change portion 214b. Second phase change portion 214b contacts third phase change portion 214c. Third phase change portion 214c contacts fourth phase change portion 214d. Fourth phase change portion 214d contacts fifth phase change portion 214e, and fifth phase change portion 214e contacts second electrode 206. Phase change material 204 provides a storage location for storing two bits of data. Dielectric material 222, such as low-k material or other suitable dielectric material, laterally completely encloses second, third, and fourth phase change portions 214b-214d. Insulation material 208 laterally completely encloses dielectric material 222, first and fifth phases change portions 214a and 214e, first electrode 202, and second electrode 206. In one embodiment, each of the memory cells 106a-106d is similar to phase change memory cell 220c.

Phase change portions 214a-214e provide a step-like pattern. Phase change portions 214a-214e provide distinct transitions between one phase change portion to another. Each phase change portion 214a-214e forms a substantially rectangular or cylindrical shape. First phase change portion 214a and fifth phase change portion 214e have substantially the same cross-sectional widths. Second phase change portion 214b and fourth phase change portion 214d have substantially the same cross-sectional widths. The cross-sections of second and fourth phase change portions 214b and 214d are narrower than the cross-sections of first and fifth phase change portions 214a and 214e. The cross-section of third phase change portion 214c is narrower than the cross-sections of second and fourth phase change portions 214b and 214d.

Phase change portions 214a-214e of phase change memory cell 220c have similar phase change material compositions and functions as the corresponding phase change portions 214a-214e of phase change memory cell 200c previously described and illustrated with reference to FIG. 2C.

Dielectric material 222 varies the thermal environment between first and fifth phase change portions 214a and 214e, which are not surrounded by dielectric material 222, second and fourth phase change portions 214b and 214d, which are surrounded with a first cross-sectional width of dielectric material 222, and third phase change portion 214c, which is surrounded with a second cross-sectional width of dielectric material 222. The first cross-sectional width of dielectric material 222 surrounding second and fourth phase change portions 214b and 214d is less than the second cross-sectional width of dielectric material 222 surrounding third phase change portion 214c. In one embodiment, dielectric material 222 has a lower thermal conductivity than insulation material 208. By varying the thermal environment between phase change portions 214a-214e, the temperature induced within each phase change portion 214a-214e is further controlled during programming. Phase change memory cell 220c operates similarly to phase change memory cell 200c previously described and illustrated with reference to FIG. 2C.

Figure 4A:
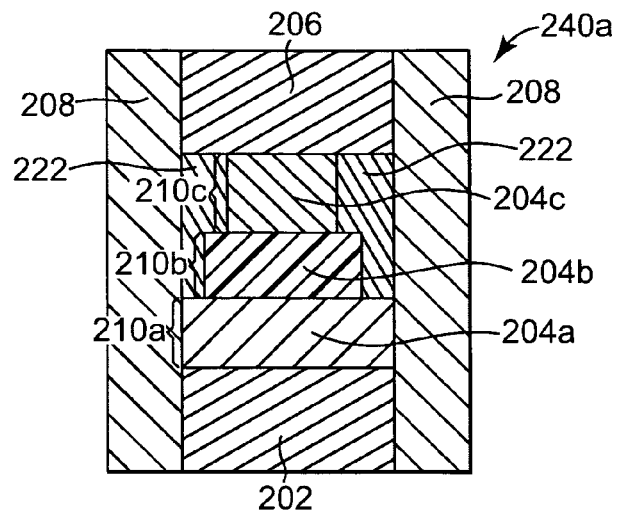
FIG. 4A illustrates a cross-sectional view of another embodiment of a phase change memory cell.

FIG. 4A illustrates a cross-sectional view of another embodiment of a phase change memory cell 240a. Phase change memory cell 240a includes first electrode 202, first phase change material 204a, second phase change material 204b, third phase change material 204c, second electrode 206, insulation material 208, and dielectric material 222. First phase change portion 210a includes first phase change material 204a. Second phase change portion 210b includes second phase change material 204b. Third phase change portion 210c includes third phase change material 204c. First electrode 202 contacts first phase change portion 210a. First phase change portion 210a contacts second phase change portion 210b. Second phase change portion 210b contacts third phase change portion 210c, and third phase change portion 210c contacts second electrode 206. Phase change material 204a-204c provides a storage location for storing two bits of data. Dielectric material 222, such as low-k material or other suitable dielectric material, laterally completely encloses second phase change portion 210b and third phase change portion 210c. Insulation material 208 laterally completely encloses dielectric material 222, first phase change portion 210a, first electrode 202, and second electrode 206. In one embodiment, each of the memory cells 106a-106d is similar to phase change memory cell 240a.

Phase change portions 210a-210c provide a step-like pattern. Phase change portions 210a-210c provide distinct transitions between one phase change portion to another. Each phase change portion 210a-210c forms a substantially rectangular or cylindrical shape. First phase change portion 210a has a larger cross-section than second phase change portion 210b. Second phase change portion 210b has a larger cross-section than third phase change portion 210c.

Phase change portions 210a-210c of phase change memory cell 240a have similar phase change material compositions and functions as the corresponding phase change portions 210a-210c of phase change memory cell 200a previously described and illustrated with reference to FIG. 2A except that at least two of phase change portions 210a-210c include different phase change materials. Dielectric material 222 varies the thermal environment between phase change portions 210a-210c as previously described and illustrated with reference to FIG. 3A. In one embodiment, dielectric material 222 is replaced with insulation material 208 in memory cell 240a.

The at least two phase change materials for phase change portions 210a-210c have different crystallization temperatures. By varying the crystallization temperature between the phase change portions 210a-210c, the transition of each phase change portion 210a-210c is further controlled during programming. Phase change memory cell 240a operates similarly to phase change memory cell 200a previously described and illustrated with reference to FIG. 2A.

Figure 4B:
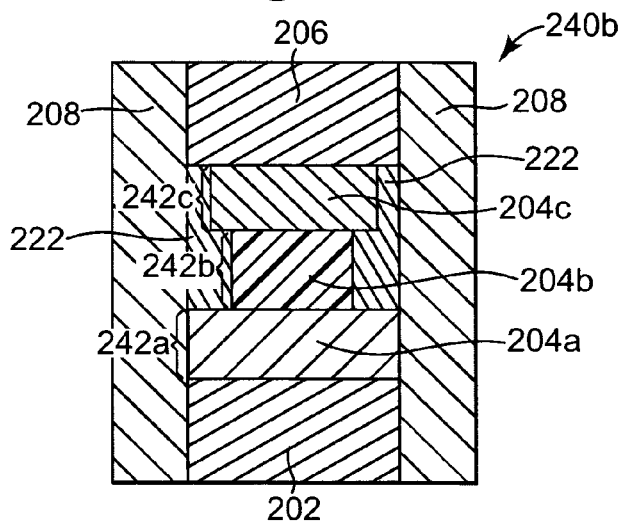
FIG. 4B illustrates a cross-sectional view of another embodiment of a phase change memory cell.

FIG. 4B illustrates a cross-sectional view of another embodiment of a phase change memory cell 240b. Phase change memory cell 240b includes first electrode 202, first phase change material 204a, second phase change material 204b, third phase change material 204c, second electrode 206, insulation material 208, and dielectric material 222. First phase change portion 242a includes first phase change material 204a. Second phase change portion 242b includes second phase change material 204b. Third phase change portion 242c includes third phase change material 204c. First electrode 202 contacts first phase change portion 242a. First phase change portion 242a contacts second phase change portion 242b. Second phase change portion 242b contacts third phase change portion 242c, and third phase change portion 242c contacts second electrode 206. Phase change material 204a-204c provides a storage location for storing 1.5 or two bits of data. Dielectric material 222, such as low-k material or other suitable dielectric material, laterally completely encloses second phase change portion 242b and third phase change portion 242c. Insulation material 208 laterally completely encloses dielectric material 222, first phase change portion 242a, first electrode 202, and second electrode 206. In one embodiment, each of the memory cells 106a-106d is similar to phase change memory cell 240b.

Phase change portions 242a-242c provide a step-like pattern. Phase change portions 242a-242c provide distinct transitions between one phase change portion to another. Each phase change portion 242a-242c forms a substantially rectangular or cylindrical shape. Second phase change portion 242b has a narrower cross-section than third phase change portion 242c. Third phase change portion 242c has a narrower cross-section than first phase change portion 242a.

The current density through first phase change portion 242a is less than the current density through third phase change portion 242c. The current density through third phase change portion 242c is less than the current density through second phase change portion 242b. Thus, a current or voltage pulse having a lower amplitude and/or duration is used to program second phase change portion 242b than to program third phase change portion 242c. Further, a current or voltage pulse having a lower amplitude and/or duration is used to program third phase change portion 242c than to program first phase change portion 242a.

Dielectric material 222 varies the thermal environment between first phase change portion 242a, which is not surrounded by dielectric material 222, second phase change portion 242b, which is surrounded with a first cross-sectional width of dielectric material 222, and third phase change portion 242c, which is surrounded with a second cross-sectional width of dielectric material 222. The first cross-sectional width of dielectric material 222 surrounding second phase change portion 242b is greater than the second cross-sectional width of dielectric material 222 surrounding third phase change portion 242c. In one embodiment, dielectric material 222 has a lower thermal conductivity than insulation material 208. By varying the thermal environment between phase change portions 242a-242c, the temperature induced within each phase change portion 242a-242c is further controlled during programming. In one embodiment, dielectric material 222 is replaced with insulation material 208 in memory cell 240b.

Phase change portions 242a-242c of phase change memory cell 240b include at least two phase change portions having different phase change materials. The at least two phase change materials for phase change portions 242a-242c have different crystallization temperatures. By varying the crystallization temperature between the phase change portions 242a-242c, the transition of each phase change portion 242a-242c is further controlled during programming.

During operation of phase change memory cell 240b, current or voltage pulses are applied between first electrode 202 and second electrode 206 to program phase change memory cell 240b. A first current or voltage pulse having a first amplitude and/or duration programs second phase change portion 242b without significantly affecting first and third phase change portions 242a and 242c. A second current or voltage pulse having a second amplitude and/or duration programs second and third phase change portions 242b and 242c without significantly affecting first phase change portion 242a. The second amplitude and/or duration is greater than the first amplitude and/or duration. A third current or voltage pulse having a third amplitude and/or duration programs phase change portions 242a-242c. The third amplitude and/or duration is greater than the second amplitude and/or duration.

By selectively programming phase change portions 242a-242c, phase change memory cell 240a can be programmed to provide four states in phase change material 204a-204c. In one embodiment, in a first state, phase change portions 242a-242c are amorphous. In a second state, second phase change portion 242b is crystalline, and first and third portions 242a and 242c are amorphous. In a third state, second and third phase change portions 242b and 242c are crystalline, and first phase change portion 242a is amorphous. In a fourth state, phase change portions 242a-242c are crystalline. In another embodiment, in a first state, phase change portions 242a-242c are crystalline. In a second state, second phase change portion 242b is amorphous, and first and third phase change portions 242a and 242c are crystalline. In a third state, second and third phase change portions 242b and 242c are amorphous, and first phase change portion 242a is crystalline. In a fourth state, phase change portions 242a-242c are amorphous. In other embodiments, any suitable number of phase change step-like portions 242 are used for obtaining a desired number of states in phase change memory cell 240b.

Figure 4C:
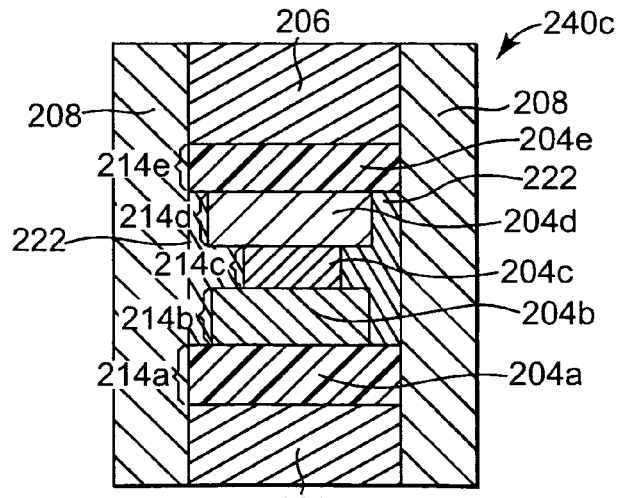
FIG. 4C illustrates a cross-sectional view of another embodiment of a phase change memory cell.

FIG. 4C illustrates a cross-sectional view of another embodiment of a phase change memory cell 240c. Phase change memory cell 240c includes first electrode 202, first phase change material 204a, second phase change material 204b, third phase change material 204c, fourth phase change material 204d, fifth phase change material 204e, second electrode 206, insulation material 208, and dielectric material 222. First phase change portion 214a includes first phase change material 204a. Second phase change portion 214b includes second phase change material 204b. Third phase change portion 214c includes third phase change material 204c. Fourth phase change portion 214d includes fourth phase change material 204d, and fifth phase change portion 214e includes fifth phase change material 204e. First electrode 202 contacts first phase change portion 214a. First phase change portion 214a contacts second phase change portion 214b. Second phase change portion 214b contacts third phase change portion 214c. Third phase change portion 214c contacts fourth phase change portion 214d. Fourth phase change portion 214d contacts fifth phase change portion 214e, and fifth phase change portion 214e contacts second electrode 206. Phase change material 204a-204e provides a storage location for storing two bits of data. Dielectric material 222, such as low-k material or other suitable dielectric material, laterally completely encloses second, third, and fourth phase change portions 214b-214d. Insulation material 208 laterally completely encloses dielectric material 222, first and fifth phases change portions 214a and 214e, first electrode 202, and second electrode 206. In one embodiment, each of the memory cells 106a-106d is similar to phase change memory cell 240c.

Phase change portions 214a-214e provide a step-like pattern. Phase change portions 214a-214e provide distinct transitions between one phase change portion to another. Each phase change portion 214a-214e forms a substantially rectangular or cylindrical shape. First phase change portion 214a and fifth phase change portion 214e have substantially the same cross-sectional widths. Second phase change portion 214b and fourth phase change portion 214d have substantially the same cross-sectional widths. The cross-sections of second and fourth phase change portions 214b and 214d are narrower than the cross-sections of first and fifth phase change portions 214a and 214e. The cross-section of third phase change portion 214c is narrower than the cross-sections of second and fourth phase change portions 214b and 214d.

Phase change portions 214a-214e of phase change memory cell 240c have similar phase change material compositions and functions as the corresponding phase change portions 214a-214e of phase change memory cell 200c previously described and illustrated with reference to FIG. 2C except that at least two of phase change portions 214a-214e include different phase change materials. Dielectric material 222 varies the thermal environment between phase change portions 214a-214e as previously described and illustrated with reference to FIG. 3C. In one embodiment, dielectric material 222 is replaced with insulation material 208 in memory cell 240c.

The at least two phase change materials for phase change portions 214a-214e have different crystallization temperatures. By varying the crystallization temperature between the phase change portions 214a-214e, the transition of each phase change portion 214a-214e is further controlled during programming. Phase change memory cell 240c operates similarly to phase change memory cell 200c previously described and illustrated with reference to FIG. 2C.

The following FIGS. 5-11 illustrate embodiments of a method for fabricating a phase change memory cell including phase change material forming a step-like pattern, such as phase change memory cell 200a previously described and illustrated with reference to FIG. 2A or phase change memory cell 220a previously described and illustrated with reference to FIG. 3A.

Figure 5:
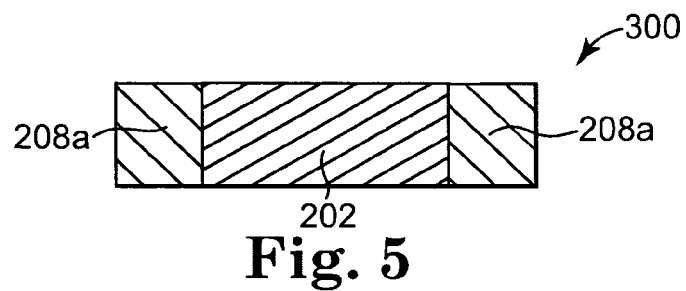
FIG. 5 illustrates a cross-sectional view of one embodiment of a preprocessed wafer.

FIG. 5 illustrates a cross-sectional view of one embodiment of a preprocessed wafer 300. Preprocessed wafer 300 includes first electrode 202, insulation material 208a, and lower wafer layers (not shown). In one embodiment, first electrode 202 is a contact plug, such as a tungsten plug, copper plug, or other suitable conducting material plug. First electrode 202 is laterally surrounded by insulation material 208a, such as $SiO_2$, FSG, BPSG, BSG, low-k material, or other suitable dielectric material, to electrically isolate first electrode 202 from adjacent device features.

Figure 6:
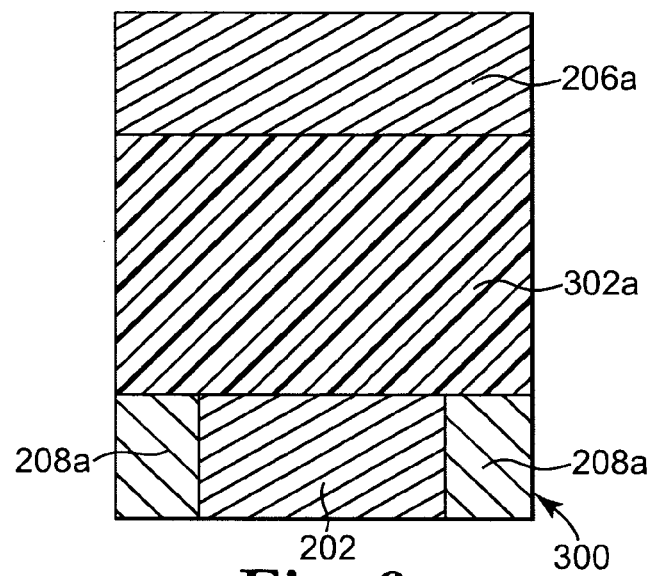
FIG. 6 illustrates a cross-sectional view of one embodiment of the preprocessed wafer, a phase change material layer, and an electrode material layer.

FIG. 6 illustrates a cross-sectional view of one embodiment of preprocessed wafer 300, a phase change material layer 302a, and an electrode material layer 206a. A phase change material, such as a chalcogenide compound material or other suitable phase change material, is deposited over preprocessed wafer 300 to provide phase change material layer 302a. In another embodiment, a dedicated bottom electrode layer may be deposited first. Phase change material layer 302a is deposited using chemical vapor deposition (CVD), metal organic chemical vapor deposition (MOCVD), plasma vapor deposition (PVD), jet vapor deposition (JVP), or other suitable deposition technique.

Electrode material, such as TiN, TaN, W, TiSiN, TiAlN, TaSiN, TaAlN, or other suitable electrode material, is deposited over phase change material layer 302a to provide electrode material layer 206a. Electrode material layer 206a is deposited using CVD, ALD, MOCVD, PVD, JVP, or other suitable deposition technique.

Figure 7:
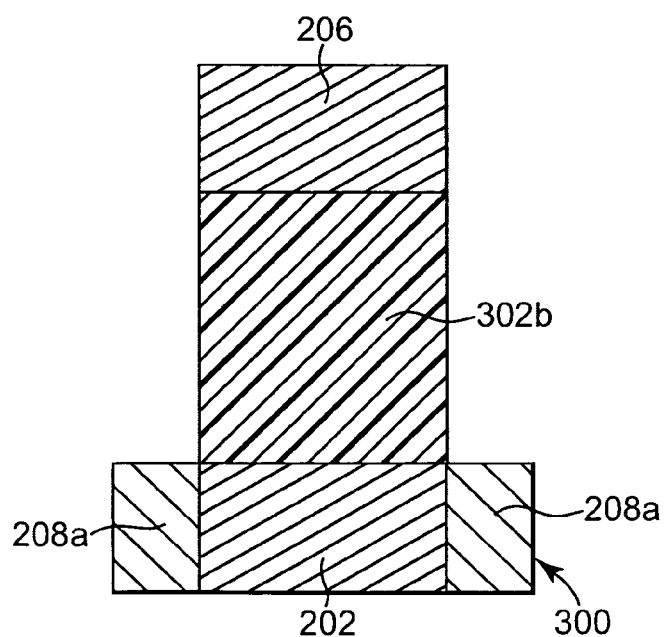
FIG. 7 illustrates a cross-sectional view of one embodiment of the preprocessed wafer, the phase change material layer, and a second electrode after etching the electrode material layer and the phase change material layer.

FIG. 7 illustrates a cross-sectional view of one embodiment of preprocessed wafer 300, phase change material layer 302b, and second electrode 206 after etching electrode material layer 206a and phase change material layer 302a. Electrode material layer 206a and phase change material layer 302a are etched to provide second electrode 206 and phase change material layer 302b. In one embodiment, second electrode 206 and phase change material layer 302b are substantially centered above first electrode 202.

Figure 8:
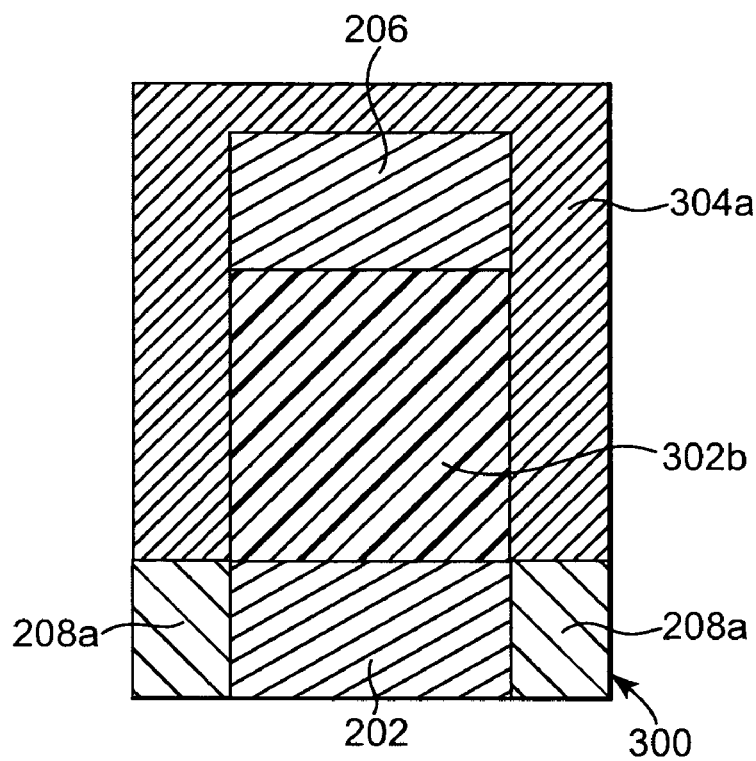
FIG. 8 illustrates a cross-sectional view of one embodiment of the preprocessed wafer, the phase change material layer, the second electrode, and a protection material layer.

FIG. 8 illustrates a cross-sectional view of one embodiment of preprocessed wafer 300, phase change material layer 302b, second electrode 206, and a protection material layer 304a. Protection material, such as a photoresist or other suitable material, is deposited over exposed portions of second electrode 206, phase change material layer 302b, and preprocessed wafer 300 to provide protection material layer 304a. Protection material layer 304a is deposited using CVD, ALD, MOCVD, PVD, JVP, spin on, or other suitable deposition technique.

Figure 9:
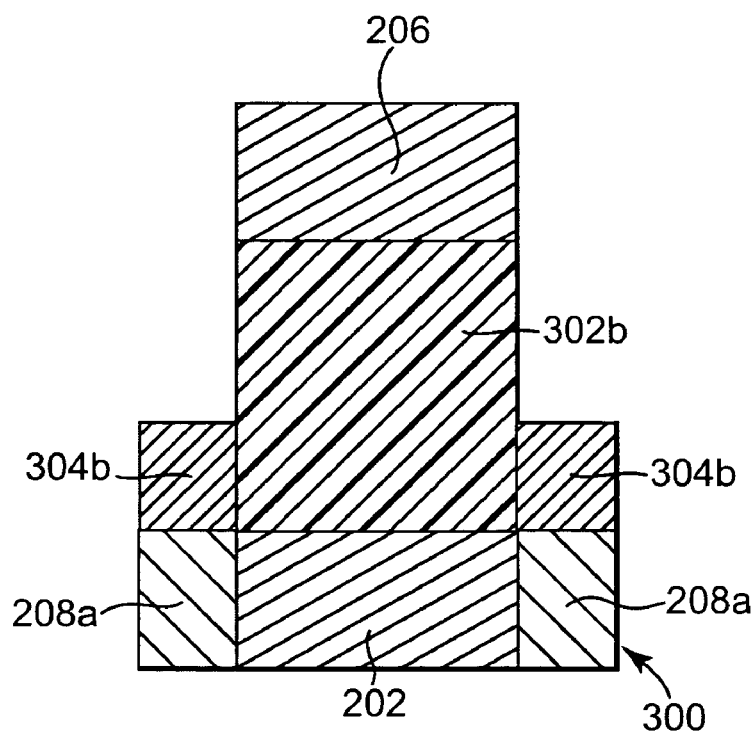
FIG. 9 illustrates a cross-sectional view of one embodiment of the preprocessed wafer, the phase change material layer, the second electrode, and the protection material layer after etching the protection material layer.

FIG. 9 illustrates a cross-sectional view of one embodiment of preprocessed wafer 300, phase change material layer 302b, second electrode 206, and protection material layer 304b after etching protection material layer 304a. Protection material layer 304a is etched to provide protection material layer 304b, which protects a first portion of phase change material layer 302b while exposing a second portion of phase change material layer 302b.

Figure 10:
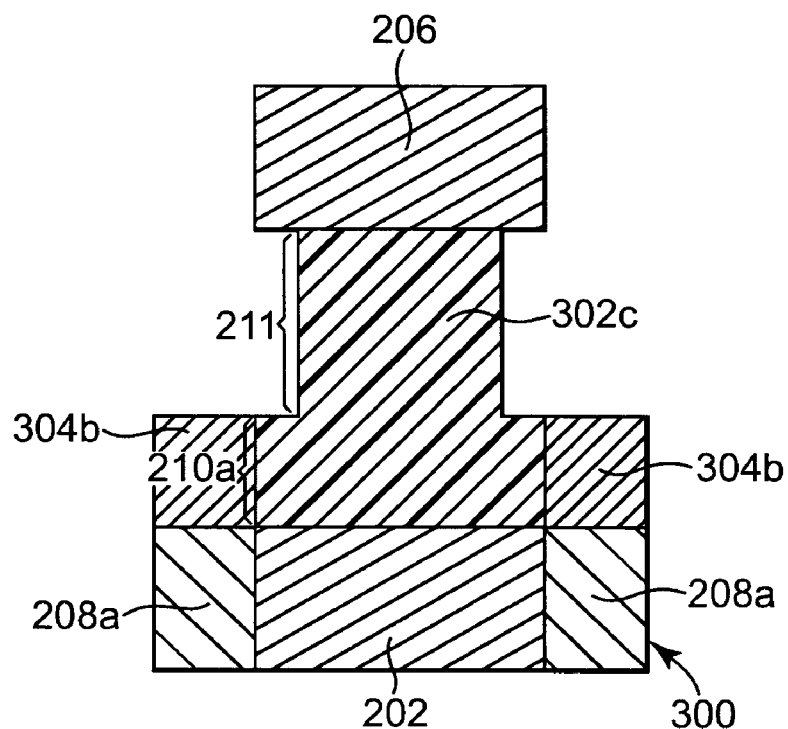
FIG. 10 illustrates a cross-sectional view of one embodiment of the preprocessed wafer, the phase change material layer, the second electrode, and the protection material layer after etching the phase change material layer.

FIG. 10 illustrates a cross-sectional view of one embodiment of preprocessed wafer 300, phase change material layer 302c, second electrode 206, and protection material layer 304b after etching phase change material layer 302b. Phase change material layer 302b is etched using a pull-back etch or other suitable etching technique to provide phase change material layer 302c. Phase change material layer 302c includes first phase change portion 210a and phase change portion 211, which is narrower than first phase change portion 210a.

Figure 11:
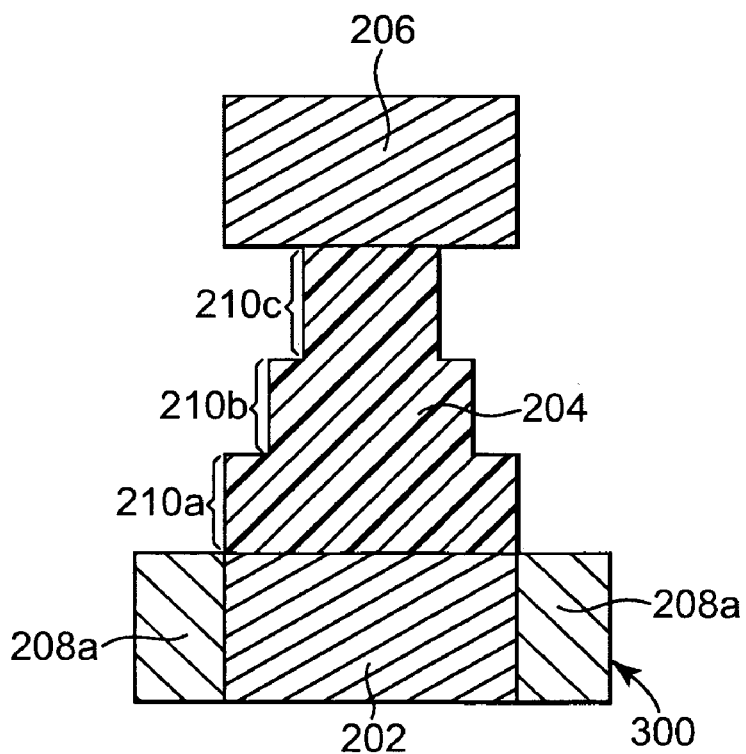
FIG. 11 illustrates a cross-sectional view of one embodiment of the preprocessed wafer, the phase change material layer, and the second electrode after etching the phase change material layer.

FIG. 11 illustrates a cross-sectional view of one embodiment of preprocessed wafer 300, phase change material 204, and second electrode 206 after etching phase change material layer 302c. Another protection material layer is deposited over exposed portions of second electrode 206, phase change material layer 302c, and preprocessed wafer 300. The protection material layer is etched to expose a portion of phase change material layer 302c. The exposed portion of phase change material layer 302c is etched, using a pull-back etch or other suitable etching technique to provide second phase change portion 210b and third phase change portion 210c. The protection material is then stripped to expose phase change material 204. In one embodiment, the process of depositing a protection layer, etching the protection layer, and etching the phase change material layer is repeated any suitable number of times to provide a desired number of phase change portions 210.

In one embodiment, insulation material, such as $SiO_2$, FSG, BPSG, BSG, low-k material, or other suitable dielectric material is deposited over exposed portions of second electrode 206, phase change material 204, and preprocessed wafer 300. The insulation material is planarized using chemical mechanical planarization (CMP) or another suitable planarization technique to expose second electrode 206 and provide phase change memory cell 200a as illustrated in FIG. 2A.

In another embodiment, dielectric material 222, such as a low-k material or other suitable material that has a thermal conductivity less than insulation material 208, is deposited over exposed portions of second electrode 206, phase change material 204, and preprocessed wafer 300. The dielectric material is etched to expose the sides of second electrode 206 and first phase change portion 210a while leaving dielectric material laterally surrounding phase change portions 210b and 210c. Insulation material, such as $SiO_2$, FSG, BPSG, BSG, low-k material, or other suitable dielectric material, is deposited over exposed portions of second electrode 206, the dielectric material, phase change material 204, and preprocessed wafer 300. The insulation material is planarized using CMP or another suitable planarization technique to expose second electrode 206 and provide phase change memory cell 220a as illustrated in FIG. 3A.

The following FIGS. 12-20 illustrate another embodiment of a method for fabricating a phase change memory cell including phase change material forming a step-like pattern, such as phase change memory cell 200c previously described and illustrated with reference to FIG. 2C or phase change memory cell 220c previously described and illustrated with reference to FIG. 3C.

Figure 12:
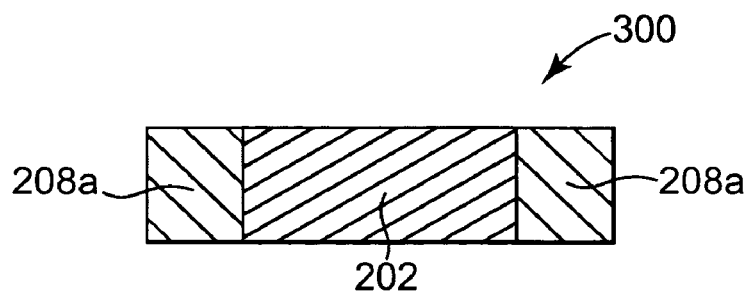
FIG. 12 illustrates a cross-sectional view of one embodiment of a preprocessed wafer.

FIG. 12 illustrates a cross-sectional view of one embodiment of a preprocessed wafer 300. Preprocessed wafer 300 includes first electrode 202, insulation material 208a, and lower wafer layers (not shown). In one embodiment, first electrode 202 is a contact plug, such as a tungsten plug, copper plug, or other suitable conducting material plug. First electrode 202 is laterally surrounded by insulation material 208a, such as $SiO_2$, FSG, BPSG, BSG, low-k material, or other suitable dielectric material, to electrically isolate first electrode 202 from adjacent device features.

Figure 13:
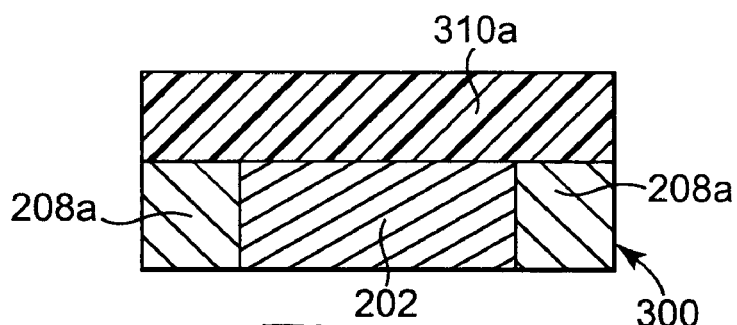
FIG. 13 illustrates a cross-sectional view of one embodiment of the preprocessed wafer and a first phase change material layer.

FIG. 13 illustrates a cross-sectional view of one embodiment of preprocessed wafer 300 and a first phase change material layer 310a. Phase change, such as a chalcogenide compound material or other suitable phase change material, is deposited over preprocessed wafer 300 to provide first phase change material layer 310a. First phase change material layer 310a is deposited using CVD, ALD, MOCVD, PVD, JVP, or other suitable deposition technique.

Figure 14:
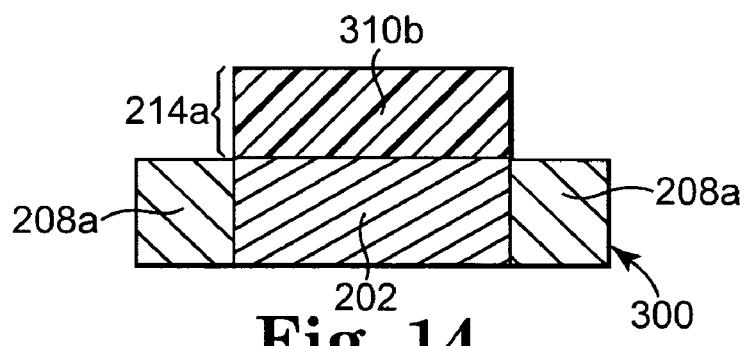
FIG. 14 illustrates a cross-sectional view of one embodiment of the preprocessed wafer and the first phase change material layer after etching the first phase change material layer.

FIG. 14 illustrates a cross-sectional view of one embodiment of preprocessed wafer 300 and first phase change material layer 310b after etching first phase change material layer 310a. First phase change material layer 310a is etched to provide first phase change material layer 310b, which provides first phase change portion 214a. In one embodiment, first phase change material layer 310b is substantially centered over first electrode 202.

Figure 15:
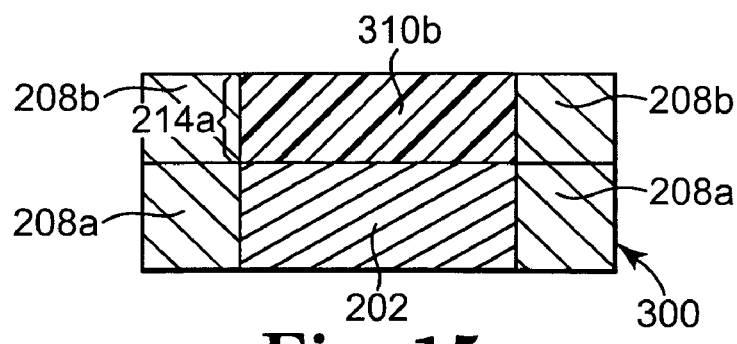
FIG. 15 illustrates a cross-sectional view of one embodiment of the preprocessed wafer, the first phase change material layer, and a first insulation material layer.

FIG. 15 illustrates a cross-sectional view of one embodiment of preprocessed wafer 300, first phase change material layer 310b, and a first insulation material layer 208b. Insulation material, such as $SiO_2$, FSG, BPSG, BSG, low-k material, or other suitable dielectric material, is deposited over exposed portions of first phase change material layer 310b and preprocessed wafer 300 to provide an insulation material layer. The insulation material layer is deposited using CVD, ALD, MOCVD, PVD, JVP, or other suitable deposition technique. The insulation material layer is planarized using CMP or another suitable planarization technique to expose first phase change material layer 310b and to provide first insulation material layer 208b.

Figure 16:
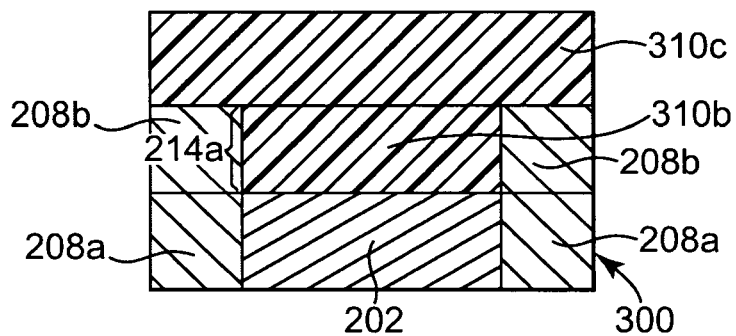
FIG. 16 illustrates a cross-sectional view of one embodiment of the preprocessed wafer, the first phase change material layer, the first insulation material layer, and a second phase change material layer.

FIG. 16 illustrates a cross-sectional view of one embodiment of preprocessed wafer 300, first phase change material layer 310b, first insulation material layer 208b, and a second phase change material layer 310c. Phase change material, such as a chalcogenide compound material or other suitable phase change material, is deposited over first phase change material layer 310b and first insulation material layer 208b to provide second phase change material layer 310c. Second phase change material layer 310c is deposited using CVD, ALD, MOCVD, PVD, JVP, or other suitable deposition technique.

Figure 17:
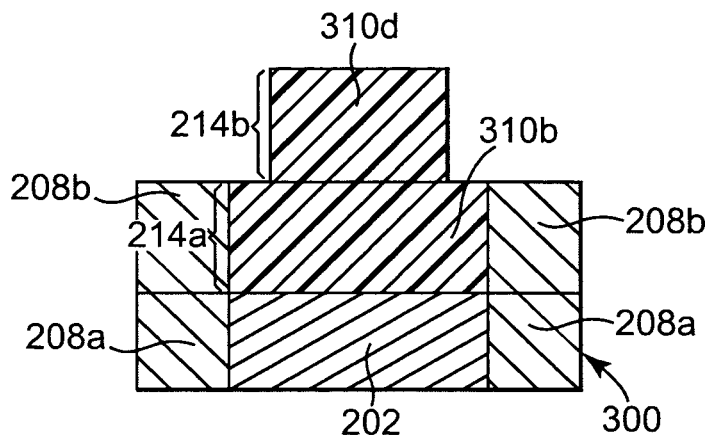
FIG. 17 illustrates a cross-sectional view of one embodiment of the preprocessed wafer, the first phase change material layer, the first insulation material layer, and the second phase change material layer after etching the second phase change material layer.

FIG. 17 illustrates a cross-sectional view of one embodiment of preprocessed wafer 300, first phase change material layer 310b, first insulation material layer 208b, and second phase change material layer 310d after etching second phase change material layer 310c. Second phase change material layer 310c is etched to provide second phase change material layer 310d, which provides second phase change portion 214b.

Figure 18:
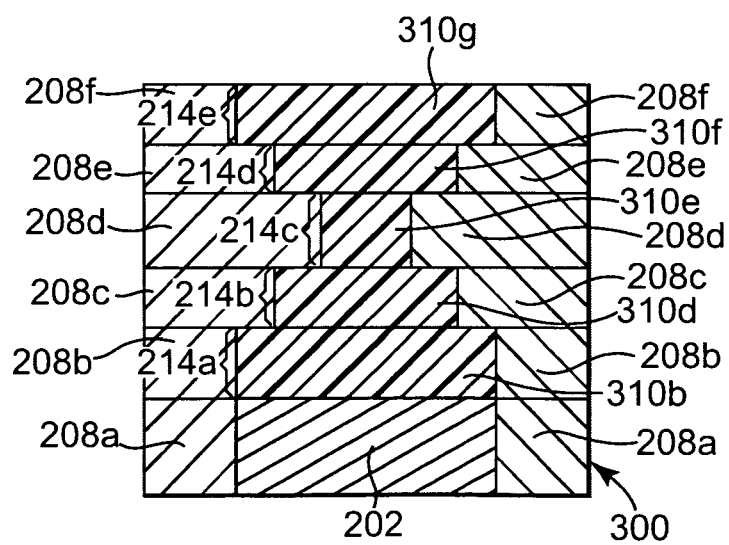
FIG. 18 illustrates a cross-sectional view of one embodiment of the preprocessed wafer, multiple phase change material layers, and multiple insulation material layers.

FIG. 18 illustrates a cross-sectional view of one embodiment of preprocessed wafer 300, multiple phase change material layers 310b, 310d, 310e, 310f, and 310g, and multiple insulation material layers 208b-208f. Multiple phase change material layers 310b, 310d, 310e, 310f, and 310g include first phase change material layer 310b, second phase change material layer 310d, third phase change material layer 310e, fourth phase change material layer 310f, and fifth phase change material layer 310g. First phase change material layer 310b provides first phase change portion 214a. Second phase change material layer 310d provides second phase change portion 214b. Third phase change material layer 310e provides third phase change portion 214c. Fourth phase change material layer 310f provides fourth phase change portion 214d, and fifth phase change material layer 310g provides fifth phase change portion 214e.

Multiple insulation material layers 208b-208f include first insulation material layer 208b, second insulation material layer 208c, third insulation material layer 208d, fourth insulation material layer 208e, and fifth insulation material layer 208f. First insulation layer material layer 208b laterally surrounds first phase change portion 214a. Second insulation material layer 208c laterally surrounds second phase change portion 214b. Third insulation material layer 208d laterally surrounds third phase change portion 214c. Fourth insulation material layer 208e laterally surrounds fourth phase change portion 214d, and fifth insulation material layer 208f laterally surrounds fifth phase change portion 214e.

The process of depositing a phase change material layer, etching the phase change material layer, depositing an insulation material layer, and planarizing the insulation material layer as illustrated in FIGS. 13-17 is repeated multiple times to provide phase change material layers 310b, 310d, 310e, 310f, and 310g, which make up phase change material 204, and insulation material layers 208b-208f, which make up insulation material 208. In one embodiment, the process of depositing a phase change material layer, etching the phase change material layer, depositing an insulation material layer, and planarizing the insulation material layer is repeated any suitable number of times to provide a desired number of phase change portions 214.

Figure 19:
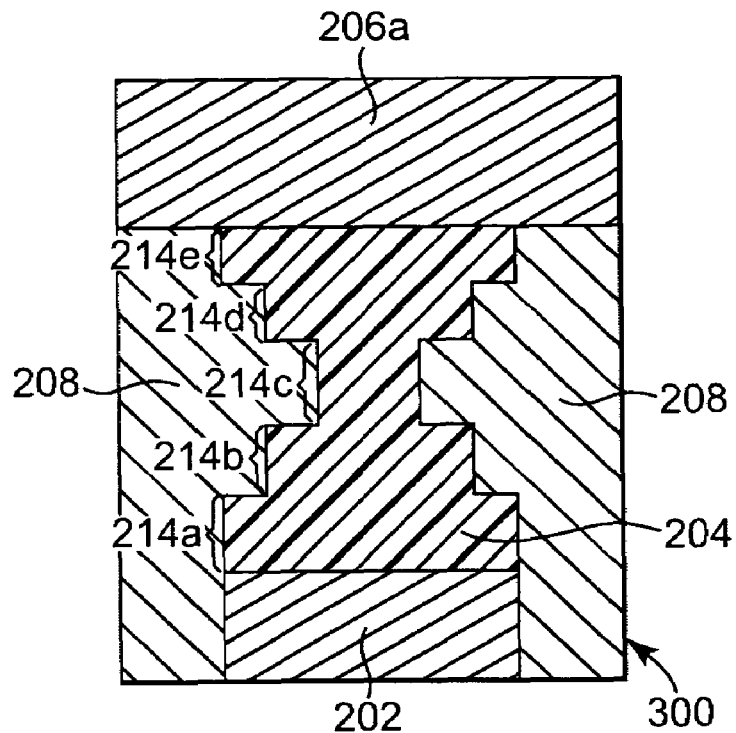
FIG. 19 illustrates a cross-sectional view of one embodiment of the preprocessed wafer, the phase change material, the insulation material, and an electrode material layer.

FIG. 19 illustrates a cross-sectional view of one embodiment of preprocessed wafer 300, phase change material 204, insulation material 208, and an electrode material layer 206a. Electrode material, such as TiN, TaN, W, TiSiN, TiAlN, TaSiN, TaAlN, or other suitable electrode material, is deposited over phase change material 204 and insulation material 208 to provide electrode material layer 206a. Electrode material layer 206a is deposited using CVD, ALD, MOCVD, PVD, JVP, or other suitable deposition technique.

Figure 20:
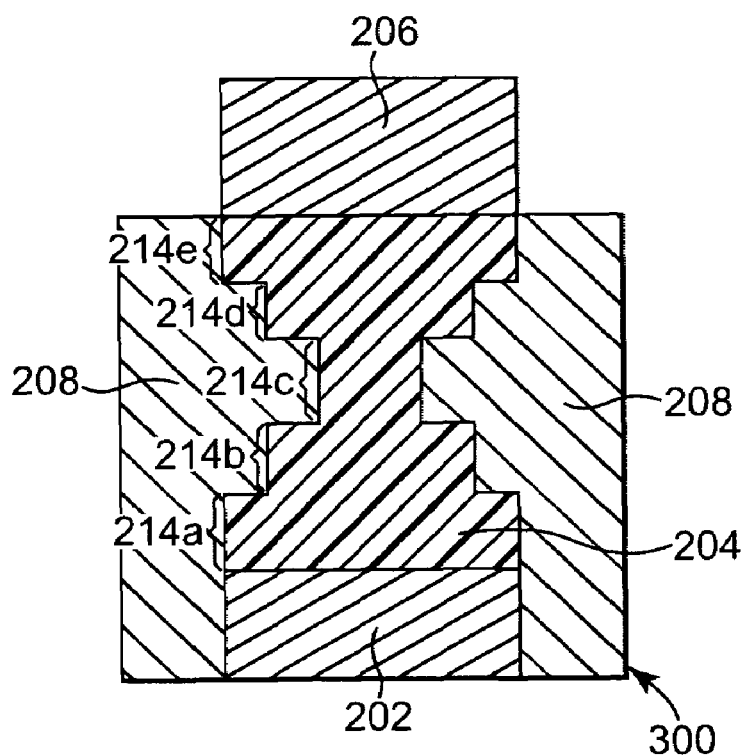
FIG. 20 illustrates a cross-sectional view of one embodiment of the preprocessed wafer, the phase change material, the insulation material, and a second electrode after etching the electrode material layer.

FIG. 20 illustrates a cross-sectional view of one embodiment of preprocessed wafer 300, phase change material 204, insulation material 208, and second electrode 206 after etching electrode material layer 206a. Electrode material layer 206a is etched to provide second electrode 206.

Insulation material, such as $SiO_2$, FSG, BPSG, BSG, low-k material, or other suitable dielectric material is deposited over exposed portions of second electrode 206 and insulation material 208. The insulation material is planarized using CMP or another suitable planarization technique to expose second electrode 206 and provide phase change memory cell 200c as illustrated in FIG. 2C.

In another embodiment, insulation material layers 208b-208f are replaced in the process described and illustrated with reference to FIGS. 15-20 with dielectric material 222. The dielectric material is etched to expose insulation material 208a, the sides of second electrode 206, and the sides of first and fifth phase change portions 214a and 214e while leaving the dielectric material surrounding second, third, and fourth phase change portions 214b-214d. Insulation material, such as $SiO_2$, FSG, BPSG, BSG, low-k material, or other suitable dielectric material is deposited over exposed portions of second electrode 206, the dielectric material, and preprocessed wafer 300. The insulation material is planarized using CMP or another suitable planarization technique to expose second electrode 206 and provide phase change memory cell 220c as illustrated in FIG. 3C.

The following FIGS. 21-30 illustrate another embodiment of a method for fabricating a phase change memory cell including phase change material forming a step-like pattern, such as phase change memory cell 200c previously described and illustrated with reference to FIG. 2C or phase change memory cell 220c previously described and illustrated with reference to FIG. 3C.

Figure 21:
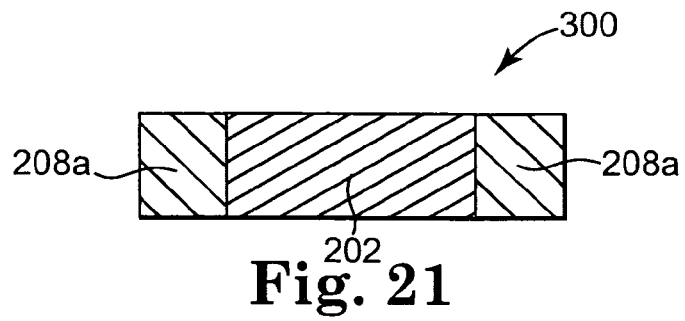
FIG. 21 illustrates a cross-sectional view of one embodiment of a preprocessed wafer.

FIG. 21 illustrates a cross-sectional view of one embodiment of a preprocessed wafer 300. Preprocessed wafer 300 includes first electrode 202, insulation material 208a, and lower wafer layers (not shown). In one embodiment, first electrode 202 is a contact plug, such as a tungsten plug, copper plug, or other suitable conducting material plug. First electrode 202 is laterally surrounded by insulation material 208a, such $SiO_2$, FSG, BPSG, BSG, low-k material, or other suitable dielectric material, to electrically isolate first electrode 202 from adjacent device features.

Figure 22:
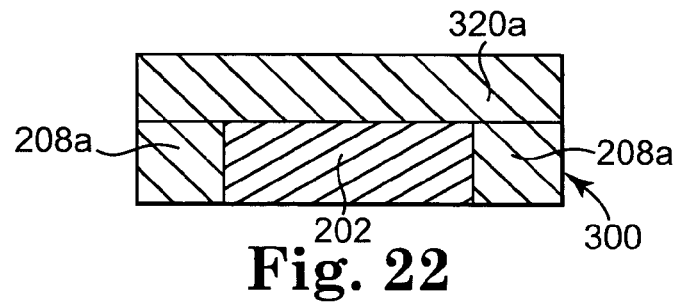
FIG. 22 illustrates a cross-sectional view of one embodiment of the preprocessed wafer and a first insulation material layer.

FIG. 22 illustrates a cross-sectional view of one embodiment of preprocessed wafer 300 and a first insulation material layer 320a. Insulation material, such $SiO_2$, FSG, BPSG, BSG, low-k material, or other suitable dielectric material, is deposited over preprocessed wafer 300 to provide first insulation material layer 320a. First insulation material layer 320a is deposited using CVD, ALD, MOCVD, PVD, JVP, or other suitable deposition technique.

Figure 23:
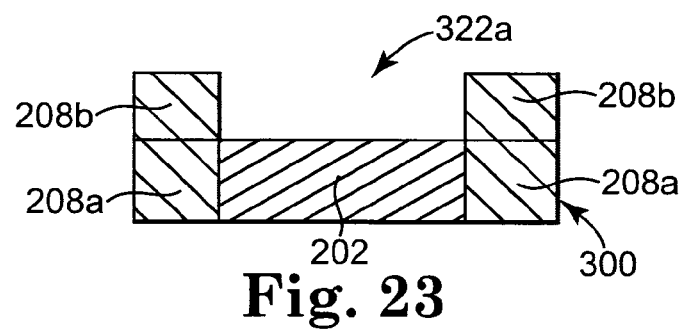
FIG. 23 illustrates a cross-sectional view of one embodiment of the preprocessed wafer and the first insulation material layer after etching the first insulation material layer.

FIG. 23 illustrates a cross-sectional view of one embodiment of preprocessed wafer 300 and first insulation material layer 208b after etching the first insulation material layer 320a. First insulation material layer 320a is etched to expose first electrode 202 to provide first insulation material layer 208b including an opening 322a. In one embodiment, opening 322a is substantially centered over first electrode 202.

Figure 24:
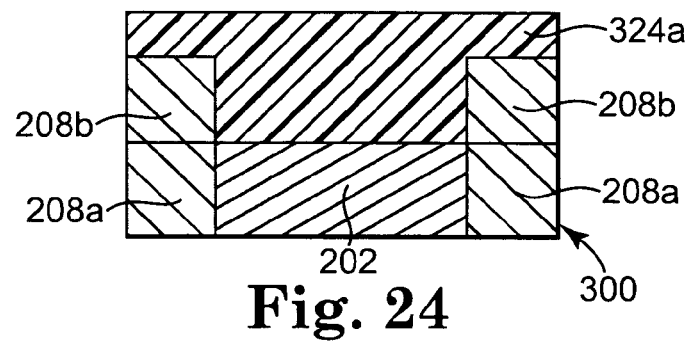
FIG. 24 illustrates a cross-sectional view of one embodiment of the preprocessed wafer, the first insulation material layer, and a first phase change material layer.

FIG. 24 illustrates a cross-sectional view of one embodiment of preprocessed wafer 300, first insulation material layer 208b, and a first phase change material layer 324a. Phase change material, such as a chalcogenide compound material or other suitable phase change material, is deposited over exposed portions of first insulation material layer 208b and preprocessed wafer 300 to provide first phase change material layer 324a. First phase change material layer 324a is deposited using CVD, ALD, MOCVD, PVD, JVP, or other suitable deposition technique.

Figure 25:
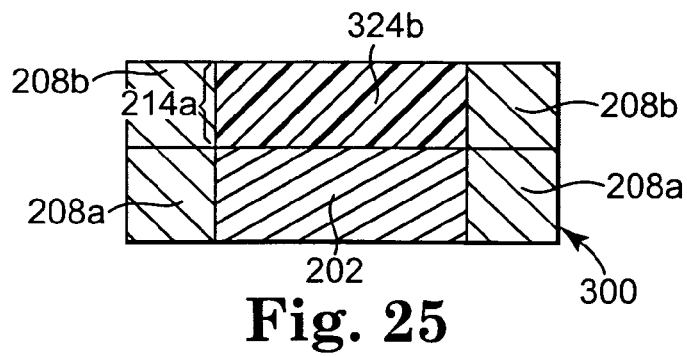
FIG. 25 illustrates a cross-sectional view of one embodiment of the preprocessed wafer, the first insulation material layer, and the first phase change material layer after planarizing the first phase change material layer.

FIG. 25 illustrates a cross-sectional view of one embodiment of preprocessed wafer 300, first insulation material layer 208b, and first phase change material layer 324b after planarizing first phase change material layer 324a. First phase change material layer 324a is planarized to expose first insulation material layer 208b and to provide first phase change material layer 324b, which provides first phase change portion 214a. First phase change material layer 324a is planarized using CMP or another suitable planarization technique.

Figure 26:
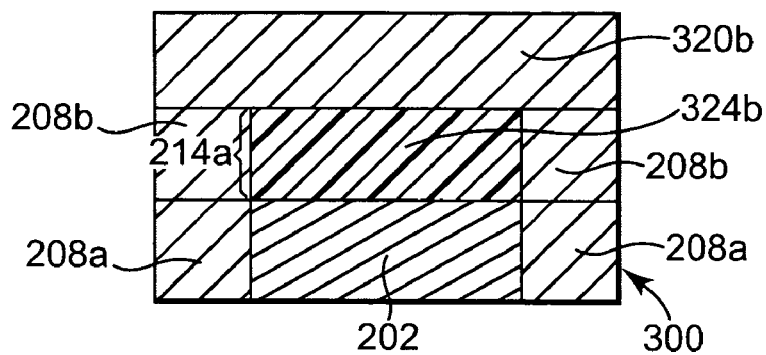
FIG. 26 illustrates a cross-sectional view of one embodiment of the preprocessed wafer, the first insulation material layer, the first phase change material layer, and a second insulation material layer.

FIG. 26 illustrates a cross-sectional view of one embodiment of preprocessed wafer 300, first insulation material layer 208b, first phase change material layer 324b, and a second insulation material layer 320b. Insulation material, such $SiO_2$, FSG, BPSG, BSG, low-k material, or other suitable dielectric material, is deposited over first insulation material layer 208b and first phase change material layer 324b to provide second insulation material layer 320b. Second insulation material layer 320b is deposited using CVD, ALD, MOCVD, PVD, JVP, or other suitable deposition technique.

Figure 27:
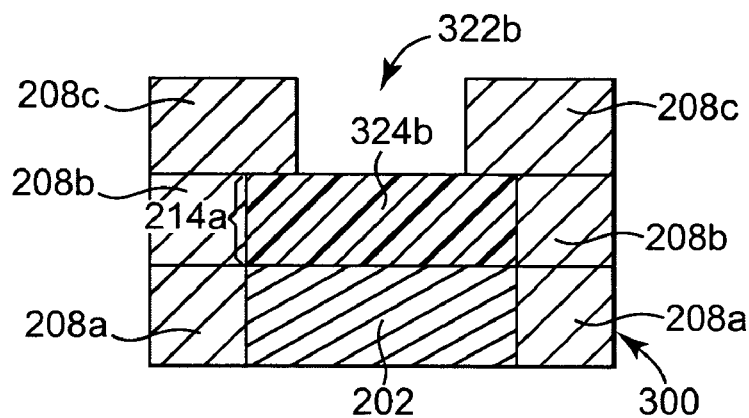
FIG. 27 illustrates a cross-sectional view of one embodiment of the preprocessed wafer, the first insulation material layer, the first phase change material layer, and the second insulation material layer after etching the second insulation material layer.

FIG. 27 illustrates a cross-sectional view of one embodiment of preprocessed wafer 300, first insulation material layer 208b, first phase change material layer 324b, and second insulation material layer 208c after etching second insulation material layer 320b. Second insulation material layer 320b is etched to expose a portion of phase change material layer 324b and to provide second insulation material layer 208c including opening 322b.

Figure 28:
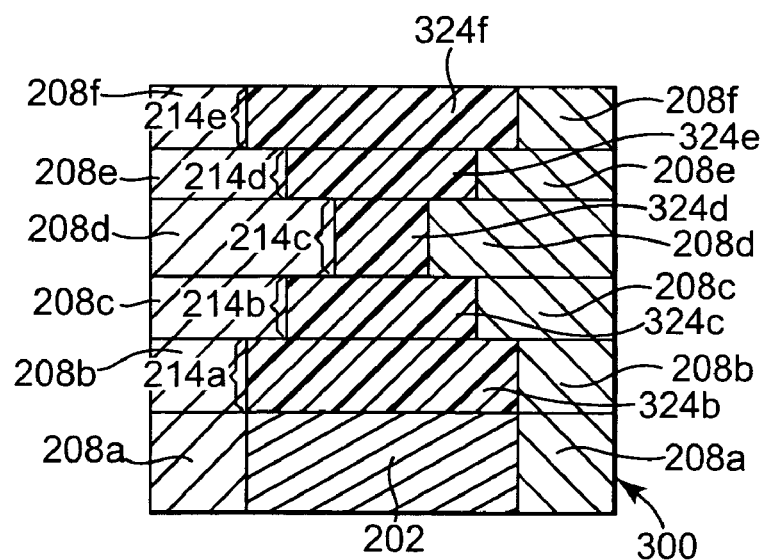
FIG. 28 illustrates a cross-sectional view of one embodiment of the preprocessed wafer, multiple insulation material layers, and multiple phase change material layers.

FIG. 28 illustrates a cross-sectional view of one embodiment of preprocessed wafer 300, multiple insulation material layers 208b-208f, and multiple phase change material layers 324b-324f. Multiple phase change material layers 324b-324f include first phase change material layer 324b, second phase change material layer 324c, third phase change material layer 324d, fourth phase change material layer 324e, and fifth phase change material layer 324f. First phase change material layer 324b provides first phase change portion 214a. Second phase change material layer 324c provides second phase change portion 214b. Third phase change material layer 324d provides third phase change portion 214c. Fourth phase change material layer 324e provides fourth phase change portion 214d, and fifth phase change material layer 324f provides fifth phase change portion 214e.

Multiple insulation material layers 208b-208f include first insulation material layer 208b, second insulation material layer 208c, third insulation material layer 208d, fourth insulation material layer 208e, and fifth insulation material layer 208f. First insulation layer material layer 208b laterally surrounds first phase change portion 214a. Second insulation material layer 208c laterally surrounds second phase change portion 214b. Third insulation material layer 208d laterally surrounds third phase change portion 214c. Fourth insulation material layer 208e laterally surrounds fourth phase change portion 214d, and fifth insulation material layer 208f laterally surrounds fifth phase change portion 214e.

The process of depositing an insulation material layer, etching the insulation material layer, depositing a phase change material layer, and planarizing the phase change material layer as illustrated in FIGS. 22-27 is repeated multiple times to provide phase change material layers 324b-324f, which make up phase change material 204, and insulation material layers 208b-208f, which make up insulation material 208. In one embodiment, the process of depositing an insulation material layer, etching the insulation material layer, depositing a phase change material layer, and planarizing the phase change material layer is repeated any suitable number of times to provide a desired number of phase change portions 214.

Figure 29:
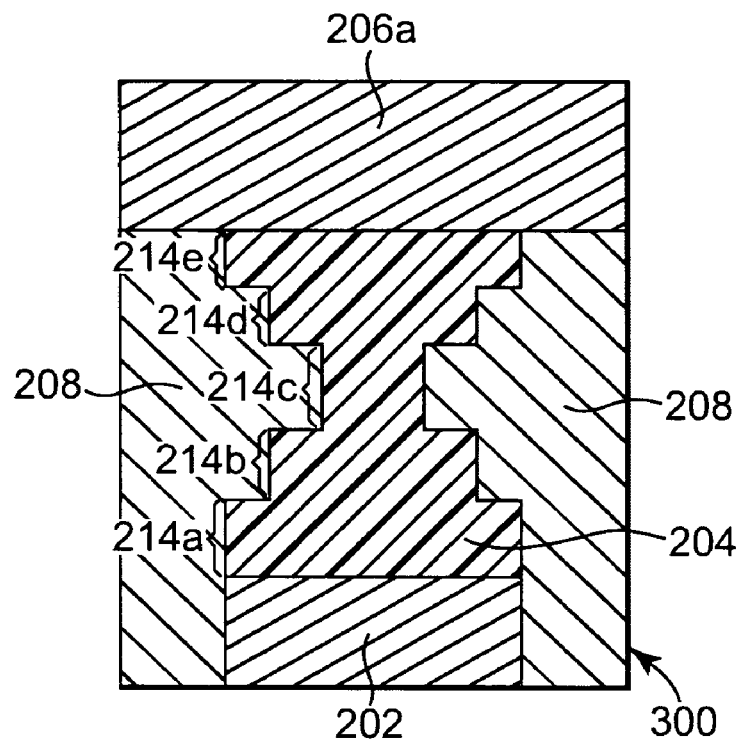
FIG. 29 illustrates a cross-sectional view of one embodiment of the preprocessed wafer, the insulation material, the phase change material, and an electrode material layer.

FIG. 29 illustrates a cross-sectional view of one embodiment of preprocessed wafer 300, phase change material 204, insulation material 208, and an electrode material layer 206a. Electrode material, such as TiN, TaN, W, TiSiN, TiAlN, TaSiN, TaAlN, or other suitable electrode material, is deposited over phase change material 204 and insulation material 208 to provide electrode material layer 206a. Electrode material layer 206a is deposited using CVD, ALD, MOCVD, PVD, JVP, or other suitable deposition technique.

Figure 30:
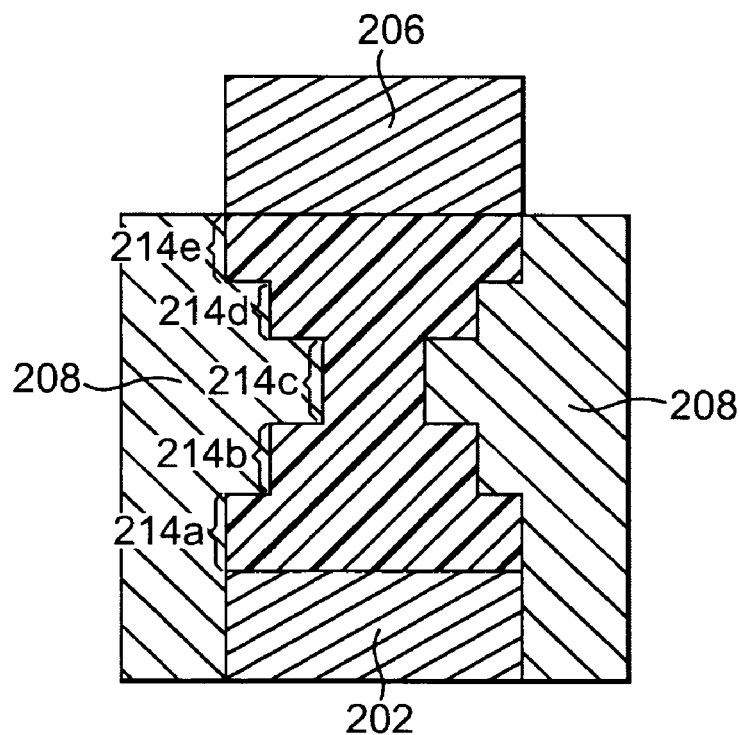
FIG. 30 illustrates a cross-sectional view of one embodiment of the preprocessed wafer, the insulation material, the phase change material, and a second electrode after etching the electrode material layer.

FIG. 30 illustrates a cross-sectional view of one embodiment of preprocessed wafer 300, phase change material 204, insulation material 208, and second electrode 206 after etching electrode material layer 206a. Electrode material layer 206a is etched to provide second electrode 206.

Insulation material, such as SiO₂, FSG, BPSG, BSG, low-k material, or other suitable dielectric material is deposited over exposed portions of second electrode 206 and insulation material 208. The insulation material is planarized using CMP or another suitable planarization technique to expose second electrode 206 and provide phase change memory cell 200c as illustrated in FIG. 2C.

In another embodiment, insulation material layers 208b-208f are replaced in the process described and illustrated with reference to FIGS. 22-30 with dielectric material 222. The dielectric material is etched to expose insulation material 208a, the sides of second electrode 206, and the sides of first and fifth phase change portions 214a and 214e while leaving the dielectric material surrounding second, third, and fourth phase change portions 214b-214d. Insulation material, such as SiO₂, FSG, BPSG, BSG, low-k material, or other suitable dielectric material is deposited over exposed portions of second electrode 206, the dielectric material, and preprocessed wafer 300. The insulation material is planarized using CMP or another suitable planarization technique to expose second electrode 206 and provide phase change memory cell 220c as illustrated in FIG. 3C.

The following FIGS. 31-36 illustrate one embodiment of a method for fabricating a phase change memory cell including phase change material forming a step-like pattern where the phase change material used varies between the phase change portions, such as phase change memory cell 240c previously described and illustrated with reference to FIG. 4C.

Figure 31:
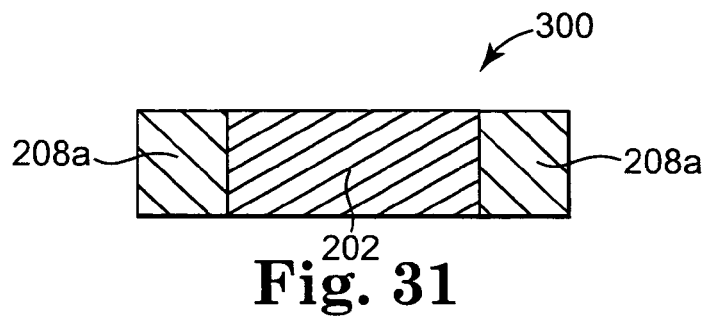
FIG. 31 illustrates a cross-sectional view of one embodiment of a preprocessed wafer.

FIG. 31 illustrates a cross-sectional view of one embodiment of a preprocessed wafer 300. Preprocessed wafer 300 includes first electrode 202, insulation material 208a, and lower wafer layers (not shown). In one embodiment, first electrode 202 is a contact plug, such as a tungsten plug, copper plug, or other suitable conducting material plug. First electrode 202 is laterally surrounded by insulation material 208a, such SiO₂, FSG, BPSG, BSG, low-k material, or other suitable dielectric material, to electrically isolate first electrode 202 from adjacent device features.

Figure 32:
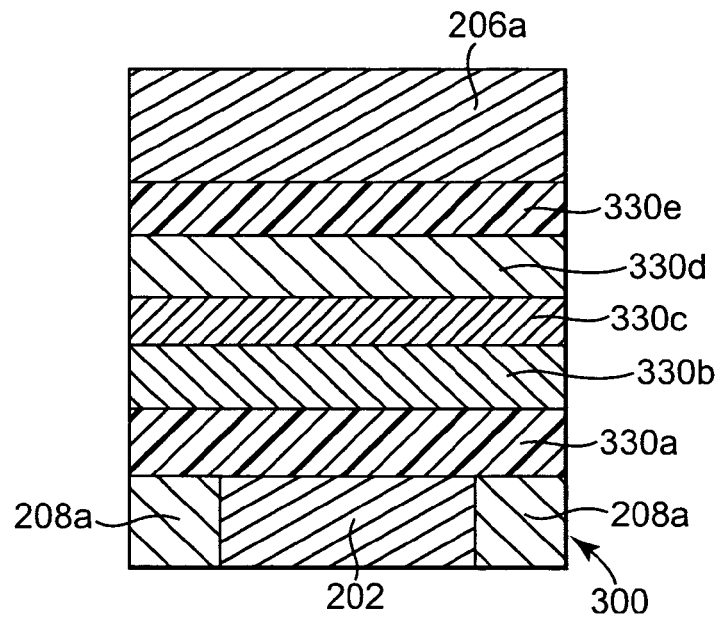
FIG. 32 illustrates a cross-sectional view of one embodiment of the preprocessed wafer, multiple phase change material layers, and an electrode material layer.

FIG. 32 illustrates a cross-sectional view of one embodiment of preprocessed wafer 300, multiple phase change material layers 330a-330e, and an electrode material layer 206a. A first phase change material, such as a chalcogenide compound material or other suitable phase change material, is deposited over preprocessed wafer 300 to provide first phase change material layer 330a. A second phase change material different than the first phase change material is deposited over first phase change material layer 330a to provide second phase change material layer 330b. A third phase change material different than the second phase change material is deposited over second phase change material layer 330b to provide third phase change material layer 330c. A fourth phase change material different than the third phase change material is deposited over third phase change material layer 330c to provide fourth phase change material layer 330d. A fifth phase change material different than the fourth phase change material is deposited over fourth phase change material layer 330d to provide fifth phase change material layer 330e. Phase change material layers 330a-330e are deposited using CVD, ALD, MOCVD, PVD, JVP, or other suitable deposition technique.

In one embodiment, first and fifth phase change material layers 330a and 330e include a first phase change material, second and fourth phase change material layers 330b and 330d includes a second phase change material different from the first phase change material, and third phase change material layer 330c includes a third phase change material different from the second phase change material. In other embodiments, other combinations are used, such as first and fifth phase change material layers 330a and 330e including a first phase change material, second phase change material layer 330b including a second phase change material different from the first phase change material, third phase change material layer 330c including a third phase change material different from the second phase change material, and fourth phase change material 330d including a fourth phase change material different from the third phase change material. In other embodiments, any suitable number of phase change material layers 330 are used to provide a desired number of phase change portions.

Electrode material, such as TiN, TaN, W, TiSiN, TiAlN, TaSiN, TaAlN, or other suitable electrode material, is deposited over phase change material layer 330e to provide electrode material layer 206a. Electrode material layer 206a is deposited using CVD, ALD, MOCVD, PVD, JVP, or other suitable deposition technique.

Figure 33:
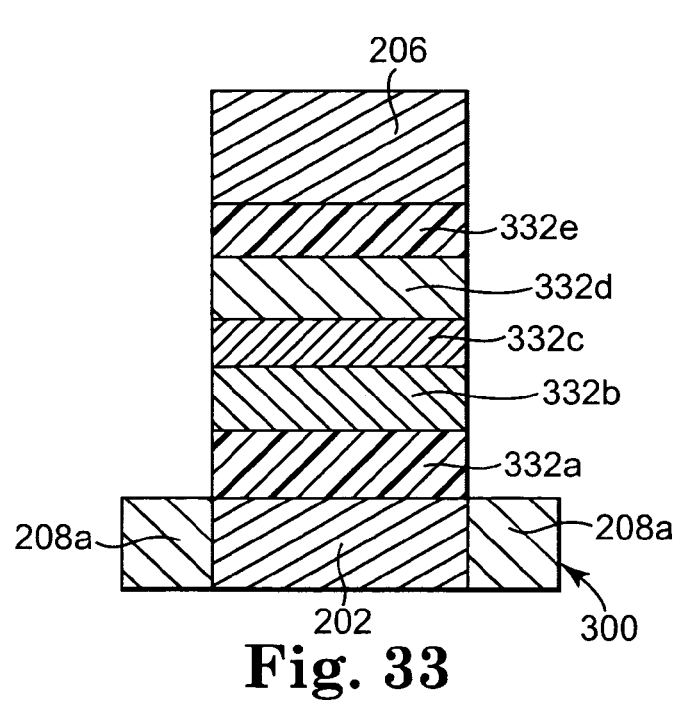
FIG. 33 illustrates a cross-sectional view of one embodiment of the preprocessed wafer, multiple phase change material layers, and a second electrode after etching the electrode material layer and the multiple phase change material layers.

FIG. 33 illustrates a cross-sectional view of one embodiment of preprocessed wafer 300, phase change material layers 332a-332e, and a second electrode 206 after etching electrode material layer 206a and phase change material layers 330a-330e. Electrode material layer 206a is etched to provide second electrode 206. Phase change material layers 330a-330e are etched to provided phase change material layers 332a-332e. In one embodiment, phase change material layers 332a-332e and second electrode 206 are substantially centered over first electrode 202.

Figure 34:
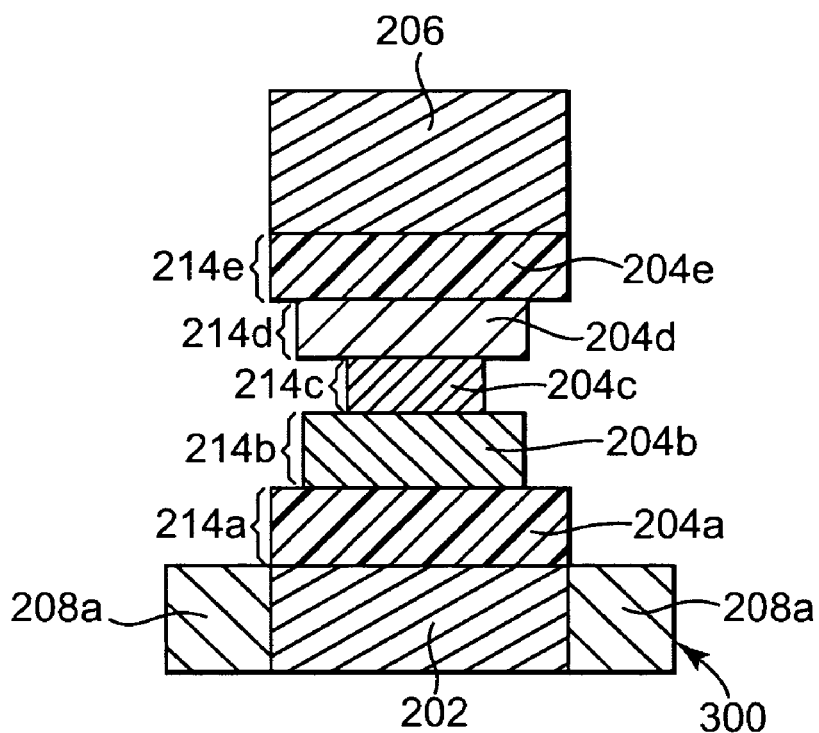
FIG. 34 illustrates a cross-sectional view of one embodiment of the preprocessed wafer, multiple phase change material layers, and the second electrode after etching the multiple phase change material layers.

FIG. 34 illustrates a cross-sectional view of one embodiment of preprocessed wafer 300, phase change material layers 204a-204e, and second electrode 206 after etching phase change material layers 332a-332e. Phase change material layers 332a-332e are etched using different pull-back etch rates to provide phase change material layers 204a-204e. Phase change material layers 204a-204e include first phase change material layer 204a, second phase change material layer 204b, third phase change material layer 204c, fourth phase change material layer 204d, and fifth phase change material layer 204e. First phase change material layer 204a provides first phase change portion 214a. Second phase change material layer 204b provides second phase change portion 214b. Third phase change material layer 204c provides third phase change portion 214c. Fourth phase change material layer 204d provides fourth phase change portion 214d, and fifth phase change material layer 204e provides fifth phase change portion 214e.

Figure 35:
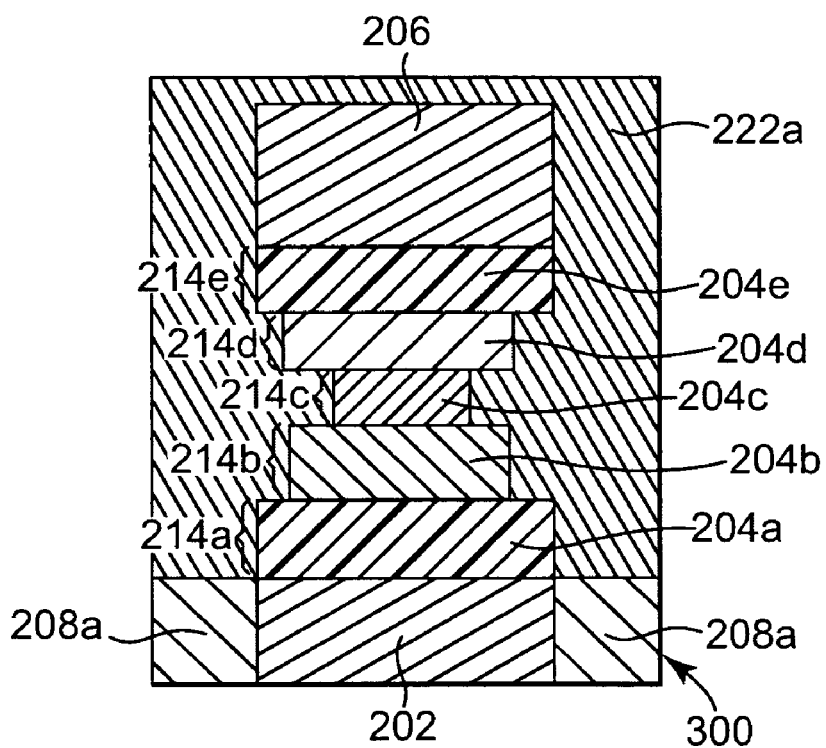
FIG. 35 illustrates a cross-sectional view of one embodiment of the preprocessed wafer, multiple phase change material layers, the second electrode, and a dielectric material layer.

FIG. 35 illustrates a cross-sectional view of one embodiment of preprocessed wafer 300, phase change material layers 204a-204e, second electrode 206, and a dielectric material layer 222a. Dielectric material, such as low-k material or other suitable dielectric material, is deposited over exposed portions of second electrode 206, phase change material layers 204a-204e, and preprocessed wafer 300 to provide dielectric material layer 222a. Dielectric material layer 222a is deposited using spin on or other suitable deposition technique.

Figure 36:
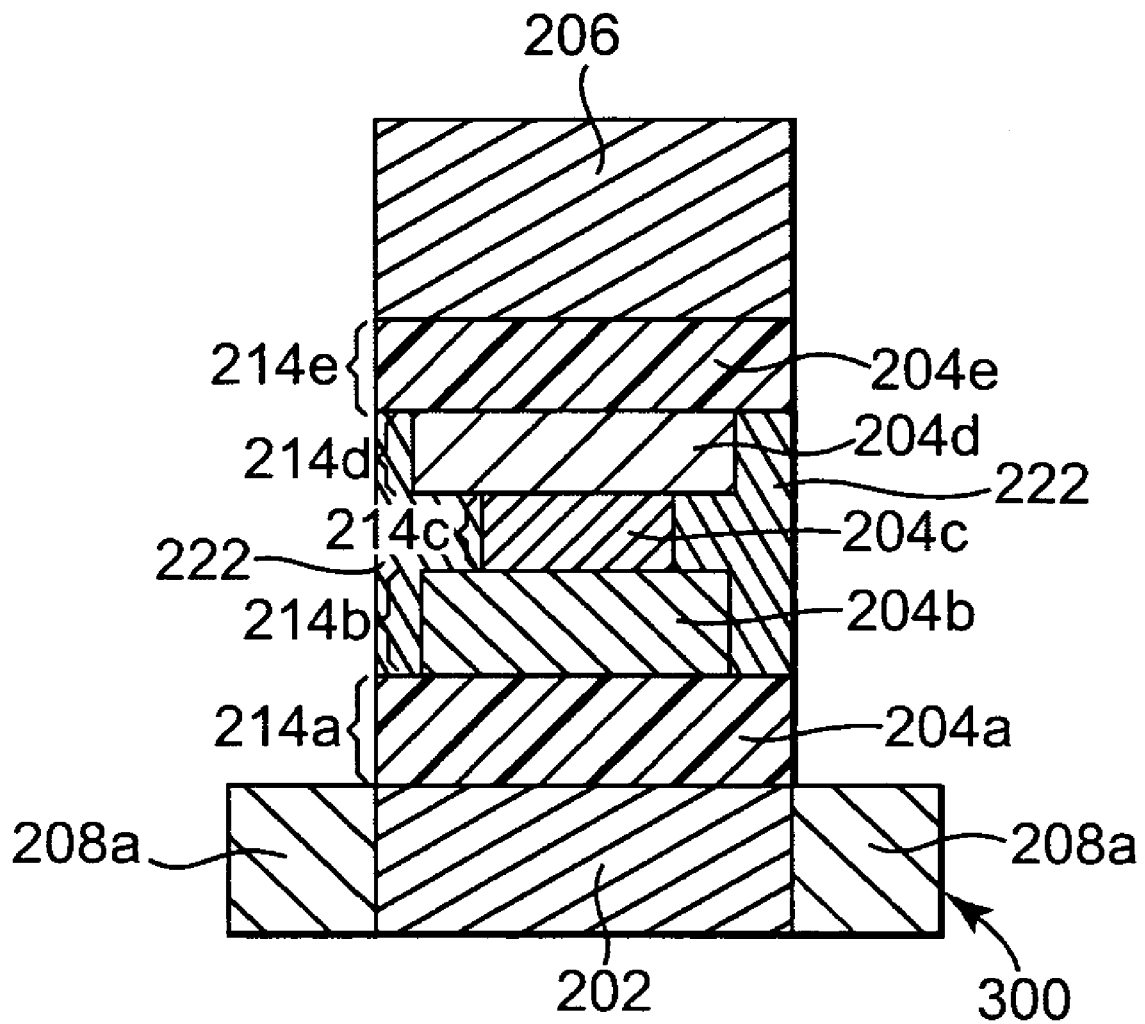
FIG. 36 illustrates a cross-sectional view of one embodiment of the preprocessed wafer, multiple phase change material layers, the second electrode, and the dielectric material layer after etching the dielectric material layer.

FIG. 36 illustrates a cross-sectional view of one embodiment of preprocessed wafer 300, phase change material layers 204a-204e, second electrode 206, and dielectric material layer 222 after etching dielectric material layer 222a. Dielectric material layer 222a is etched using a back etch or other suitable etch to provide dielectric material layer 222, which laterally surrounds second, third, and fourth phase change portions 214b-214d.

Insulation material, such as SiO$_2$, FSG, BPSG, BSG, low-k material, or other suitable dielectric material is deposited over exposed portions of second electrode 206, phase change material layers 204a and 204e, dielectric material layer 222, and preprocessed wafer 300. The insulation material is planarized using CMP or another suitable planarization technique to expose second electrode 206 and provide phase change memory cell 240c as illustrated in FIG. 4C.

Embodiments of the methods described and illustrated with reference to FIGS. 5-36 can be subdivided and/or combined to fabricate memory cells including phase change material forming step-like patterns as illustrated in FIGS. 2A-2C, memory cells including step-like patterns and varying thermal environments as illustrated in FIGS. 3A-3C, memory cells including step-like patterns using different phase change materials as illustrated in FIGS. 4A-4C, or combinations thereof.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit having a memory comprising:
   a first electrode;
   a second electrode; and
   contiguous resistivity changing material between the first electrode and the second electrode, the resistivity changing material having a step-like programming characteristic.

2. The integrated circuit of claim 1, wherein the resistivity changing material forms a step-like pattern.

3. The integrated circuit of claim 2, wherein the resistivity changing material comprises a plurality of rectangular or cylindrical portions.

4. The integrated circuit of claim 1, further comprising:
   an insulation material laterally surrounding the resistivity changing material, the first electrode, and the second electrode.

5. The integrated circuit of claim 1, further comprising:
   a first dielectric material laterally surrounding at least a portion of the resistivity changing material, the first dielectric material having a first thermal conductivity; and
   a second dielectric material laterally surrounding the first dielectric material, the first electrode, and the second electrode, the second dielectric material having a second thermal conductivity greater than the first thermal conductivity.

6. The integrated circuit of claim 5, wherein the first dielectric material comprises a low-k material.

7. A memory cell comprising:
   a first electrode;
   a second electrode; and
   a plurality of phase change material portions between the first electrode and the second electrode, each of the phase change material portions directly contacting another of the phase change material portions,
   wherein a current density through one of the phase change material portions is different from a current density through another of the phase change material portions.

8. The memory cell of claim 7, wherein each of the phase change material portions forms one of a rectangular shape and a cylindrical shape.

9. The memory cell of claim 7, wherein at least two of the phase change material portions have different cross-sectional widths.

10. The memory cell of claim 7, further comprising:
    an insulation material laterally surrounding the phase change material portions, the first electrode, and the second electrode.

11. The memory cell of claim 7, further comprising:
    a first dielectric material laterally surrounding at least one of the phase change material portions, the first dielectric material having a first thermal conductivity; and
    a second dielectric material laterally surrounding the first dielectric material, the first electrode, and the second electrode, the second dielectric material having a second thermal conductivity greater than the first thermal conductivity.

12. The memory cell of claim 11, wherein the first dielectric material comprises a low-k material.

13. A memory cell comprising:
    a first electrode;
    a second electrode; and
    a plurality of phase change material layers between the first electrode and the second electrode, the phase change material layers forming a step-like pattern, each of the phase change material layers directly contacting another of the phase change material layers,
    wherein at least two of the phase change material layers comprise different phase change materials.

14. The memory cell of claim 13, wherein at least two of the phase change material layers have different crystallization temperatures.

15. The memory cell of claim 13, wherein each of the phase change material layers forms one of a rectangular shape and a cylindrical shape.

16. The memory cell of claim 13, wherein at least two of the phase change material layers have different cross-sectional widths.

17. The memory cell of claim 13, further comprising:
    an insulation material laterally surrounding the phase change material layers, the first electrode, and the second electrode.

18. The memory cell of claim 13, further comprising:
    a first dielectric material laterally surrounding at least one of the phase change material layers, the first dielectric material having a first thermal conductivity; and
    a second dielectric material laterally surrounding the first dielectric material, the first electrode, and the second electrode, the second dielectric material having a second thermal conductivity greater than the first thermal conductivity.

19. The memory cell of claim 18, wherein the first dielectric material comprises a low-k material.

* * * * *